US011354562B2

United States Patent
Tran et al.

(10) Patent No.: US 11,354,562 B2
(45) Date of Patent: Jun. 7, 2022

(54) PROGRAMMABLE NEURON FOR ANALOG NON-VOLATILE MEMORY IN DEEP LEARNING ARTIFICIAL NEURAL NETWORK

(71) Applicant: Silicon Storage Technology, Inc., San Jose, CA (US)

(72) Inventors: Hieu Van Tran, San Jose, CA (US); Stanley Hong, San Jose, CA (US); Anh Ly, San Jose, CA (US); Thuan Vu, San Jose, CA (US); Hien Pham, Ho Chi Minh (VN); Kha Nguyen, Ho Chi Minh (VN); Han Tran, Ho Chi Minh (VN)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 1047 days.

(21) Appl. No.: 15/936,983

(22) Filed: Mar. 27, 2018

(65) Prior Publication Data
US 2019/0205729 A1    Jul. 4, 2019

Related U.S. Application Data

(60) Provisional application No. 62/613,373, filed on Jan. 3, 2018.

(51) Int. Cl.
G06N 3/04    (2006.01)
G06F 17/16    (2006.01)
(Continued)

(52) U.S. Cl.
CPC ............... *G06N 3/04* (2013.01); *G06F 17/16* (2013.01); *G06N 3/063* (2013.01); *G06N 3/0635* (2013.01);
(Continued)

(58) Field of Classification Search
CPC . G06F 17/16; G06N 3/02; G06N 3/04; G06N 3/08; G06N 3/0454; G06N 3/0481;
(Continued)

(56) References Cited

U.S. PATENT DOCUMENTS 5,029,130 A    7/1991 Yeh
5,142,666 A    8/1992 Yoshizawa
(Continued)

FOREIGN PATENT DOCUMENTS

WO    2017/144372    8/2017

OTHER PUBLICATIONS

Basu et al. "A floating-gate-based field-programmable analog array." IEEE Journal of Solid-State Circuits 45.9 (2010): 1781-1794. (Year: 2010).*
(Continued)

Primary Examiner — Kamran Afshar
Assistant Examiner — Randall K. Baldwin
(74) Attorney, Agent, or Firm — DLA Piper LLP US

(57) ABSTRACT

Numerous embodiments for processing the current output of a vector-by-matrix multiplication (VMM) array in an artificial neural network are disclosed. The embodiments comprise a summer circuit and an activation function circuit. The summer circuit and/or the activation function circuit comprise circuit elements that can be adjusted in response to the total possible current received from the VMM to optimize power consumption.

39 Claims, 32 Drawing Sheets

(51) Int. Cl.
  *G06N 3/063* (2006.01)
  *G06N 3/08* (2006.01)
  *G11C 16/04* (2006.01)
  *G11C 11/54* (2006.01)
  *H03F 3/45* (2006.01)

(52) U.S. Cl.
  CPC .......... *G11C 11/54* (2013.01); *G11C 16/0425* (2013.01); *H03F 3/45475* (2013.01); *G06N 3/08* (2013.01); *H03F 3/45269* (2013.01); *H03F 2203/45524* (2013.01)

(58) Field of Classification Search
  CPC ...... G06N 3/063; G06N 3/0635; G11C 11/54; G11C 16/04; G11C 16/0425
  See application file for complete search history.

(56) References Cited

U.S. PATENT DOCUMENTS

| | | | |
|---|---|---|---|
| 5,256,911 A | 10/1993 | Holler et al. | |
| 5,264,734 A | 11/1993 | Holler et al. | |
| 5,305,250 A | 4/1994 | Salem et al. | |
| 6,041,322 A * | 3/2000 | Meng | G06N 3/063 706/43 |
| 6,747,310 B2 | 6/2004 | Fan | |
| 6,829,598 B2 | 12/2004 | Milev | |
| 8,532,602 B2 | 9/2013 | Pehlivanoglu | |
| 8,924,321 B2 | 12/2014 | Kang et al. | |
| 10,776,684 B1 * | 9/2020 | Agarwal | G06N 3/08 |
| 2004/0150032 A1 * | 8/2004 | Wu | H01L 29/42324 257/315 |
| 2010/0287440 A1 * | 11/2010 | Alrod | H03M 13/616 714/752 |
| 2011/0235419 A1 * | 9/2011 | Ishimaru | G11C 16/0466 365/185.15 |
| 2015/0170025 A1 * | 6/2015 | Wu | G11C 13/0069 706/25 |
| 2017/0117291 A1 * | 4/2017 | Or-Bach | H01L 27/11565 |
| 2017/0277658 A1 | 9/2017 | Pratas et al. | |
| 2017/0337466 A1 | 11/2017 | Bayat | |
| 2018/0005110 A1 * | 1/2018 | Gokmen | G06N 3/063 |
| 2018/0300618 A1 * | 10/2018 | Obradovic | H01L 27/11556 |
| 2021/0019609 A1 * | 1/2021 | Strukov | G06N 3/049 |
| 2022/0004860 A1 * | 1/2022 | Tran | G11C 11/4074 |
| 2022/0013171 A1 * | 1/2022 | Terai | G11C 13/0028 |

OTHER PUBLICATIONS

Hasler et al. "Finding a roadmap to achieve large neuromorphic hardware systems." Frontiers in neuroscience 7 (2013): 118. (Year: 2013).*

Hu et al. "Memristor crossbar-based neuromorphic computing system: A case study." IEEE transactions on neural networks and learning systems 25.10 (2014): 1864-1878. (Year: 2014).*

Chi et al. "Prime: A novel processing-in-memory architecture for neural network computation in reram-based main memory." ACM SIGARCH Computer Architecture News 44.3 (2016): 27-39. (Year: 2016).*

Guo, Xinjie. Mixed signal neurocomputing based on floating-gate memories. Diss. UC Santa Barbara, 2017: i-93 (Year: 2017).*

Chi, Ping, et al. "Processing-in-memory in ReRAM-based main memory." SEAL-lab Technical Report 2015-001 (2015). (Year: 2016).*

Liu, Xiaoxiao, et al. "Harmonica: A framework of heterogeneous computing systems with memristor-based neuromorphic computing accelerators." IEEE Transactions on Circuits and Systems I: Regular Papers 63.5 (2016): 617-628. (Year: 2016).*

U.S. Appl. No. 15/826,345, filed Nov. 29, 2017 entitled "High Precision And Highly Efficient Tuning Mechanisms And Algorithms . . . Networks".

Extended European Search Report corresponding to the related European Patent Application No. 18898774.7 dated Sep. 9, 2021.

Ghomi, et al., "Design of a New CMOS Low-Power Analogue Neuron," pp. 67-75, IETE Journal of Research, Aug. 23, 2017.

Rajendran, "Scalable Hardware Architecture for Memristor Based Artificial Neural Network Systems," Thesis, pp. 1-93, Feb. 5, 2016—retrieved from the Internet.

Eberhardt, et al., "Analog VLSI Neural Networks: Implementation Issues and Examples in Optimization and Supervised Learning," IEEE Transactions on Industrial Electronics, vol. 39, No. 6, Dec. 1992, pp. 552-564.

* cited by examiner

FIGURE 10

| | WL | WL-unsel | BL | | BL-unsel | SL | SL-unsel |
|---|---|---|---|---|---|---|---|
| Read | 1-3.5V | -0.5V/0V | 0.6-2V | (Ineuron) | 0.6V-2V/0V | 0V | 0V |
| Erase | ~5-13V | 0V | 0V | | 0V | 0V | 0V |
| Program | 1-2V | -0.5V/0V | 0.1-3 uA | | Vinh ~2.5V | 4-10V | 0-1V/FLT |

FIGURE 12

| | WL | WL-unsel | BL | BL-unsel | SL | SL-unsel |
|---|---|---|---|---|---|---|
| Read | 1-3.5V | -0.5V/0V | 0.6-2V | 0.6V-2V/0V | ~0.3-1V (Ineuron) | 0V |
| Erase | ~5-13V | 0V | 0V | 0V | 0V | SL-inhibit (~4-8V) |
| Program | 1-2V | -0.5V/0V | 0.1-3 uA | Vinh ~2.5V | 4-10V | 0-1V/FLT |

FIGURE 14

| | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2V | -0.5V/0V | 0.6-2V (Ineuron) | 0V | 0-2.6V | 0-2.6V | 0-2.6V | 0-2.6V | 0-2.6V | 0V | 0V |
| Erase | 0V | 0V | 0V | 0V | 0V | 0-2.6v / CGINH (4-8V) | 0-2.6V | 5-12V | 0-2.6V | 0V | 0V |
| Program | 0.7-1V | -0.5V/0V | 0.1-1uA | Vinh (1-2V) | 4-11V | 0-2.6V | 0-2.6V | 4.5-5V | 0-2.6V | 4.5-5V | 0-1V |

FIGURE 16

| | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2V | -0.5V/0V | 0.6-2V | 0V | 0-2.6V | 0-2.6V | 0-2.6V | 0-2.6V | 0-2.6V | 0.3-1V (Ineuron) | 0V |
| Erase | 0V | 0V | 0V | 0V | 0V | 0-2.6V | 0-2.6V | 5-12V | 0-2.6V | 0V | 0V |
| Program | 0.7-1V | -0.5V/0V | 0.1-1uA | Vinh (1-2V) | 4-11V | 0-2.6V | 0-2.6V | 4.5-5V | 0-2.6V | 4.5-5V | 0-1V |

1800

PROGRAMMABLE NEURON FOR ANALOG NON-VOLATILE MEMORY IN DEEP LEARNING ARTIFICIAL NEURAL NETWORK

PRIORITY CLAIM

This application claims priority to U.S. Provisional Patent Application No. 62/613,373, filed on Jan. 3, 2018, and titled, "Programmable Neuron For Analog Neuromorphic Memory In Artificial Neural Network," which is incorporated by reference herein.

FIELD OF THE INVENTION

Numerous embodiments for processing the current output of a vector-by-matrix multiplication (VMM) array in an artificial neural network are disclosed. The embodiments comprise a summer circuit and an activation function circuit. The summer circuit and/or the activation function circuit comprise circuit elements that can be adjusted in response to the total possible current received from the VMM to optimize power consumption.

BACKGROUND OF THE INVENTION

Artificial neural networks mimic biological neural networks (the central nervous systems of animals, in particular the brain) which are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows, and have numeric weights that can be tuned based on experience. This makes neural networks adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical neural networks rely on a very large number of synapses, enabling high connectivity between neurons, i.e. a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. patent application Ser. No. 15/594,439, which is incorporated by reference. The non-volatile memory arrays operate as analog neuromorphic memory. The neural network device includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells is configured to multiply the first plurality of inputs by the stored weight values to generate the first plurality of outputs.

Each non-volatile memory cells used in the analog neuromorphic must be erased and programmed to hold a very specific and precise amount of charge in the floating gate. For example, each floating gate must hold one of N different values, where N is the number of different weights that can be indicated by each cell. Examples of N include 16, 32, and 64.

Applicant also has disclosed improved mechanisms and algorithms for tuning an analog neuromorphic memory used in artificial neural networks in U.S. patent application Ser. No. 15/826,345, which is incorporated by reference.

Artificial neural networks that utilize analog neomorphic memory typically comprise a summer and activation function circuit after each VMM stage. The summer converts a current signal from the VMM into a voltage signal, and then the activation function circuit normalizes the voltage signal and generates a normalized current signal, which can then be provided to the next VMM stage. The prior art summer and activation circuits typically are not flexible and cannot be configured for each particular VMM array. This is problematic, because VMMs might vary in the maximum level of current they can output.

What is needed are improved summer and activation circuits for use in an artificial neural network where summer and activation circuits can be adjusted or trimmed to account for the characteristics of a particular VMM.

SUMMARY OF THE INVENTION

Numerous embodiments for processing the current output of a vector-by-matrix multiplication (VMM) array in an artificial neural network are disclosed. The embodiments comprise a summer circuit and an activation function circuit. The summer circuit and/or the activation function circuit comprise circuit elements that can be adjusted in response to the total possible current received from the VMM to optimize power consumption.

BRIEF DESCRIPTION OF THE DRAWINGS

FIG. 10 depicts operating voltages to perform operations on the non-volatile memory cells of FIG. 9.

FIG. 12 depicts operating voltages to perform operations on the non-volatile memory cells of FIG. 11.

FIG. 14 depicts operating voltages to perform operations on the non-volatile memory cells of FIG. 13.

FIG. 16 depicts operating voltages to perform operations on the non-volatile memory cells of FIG. 15.

DETAILED DESCRIPTION OF THE INVENTION

The artificial neural networks of the present invention utilize a combination of CMOS technology and non-volatile memory arrays.

Non-Volatile Memory Cells

Figure 1:
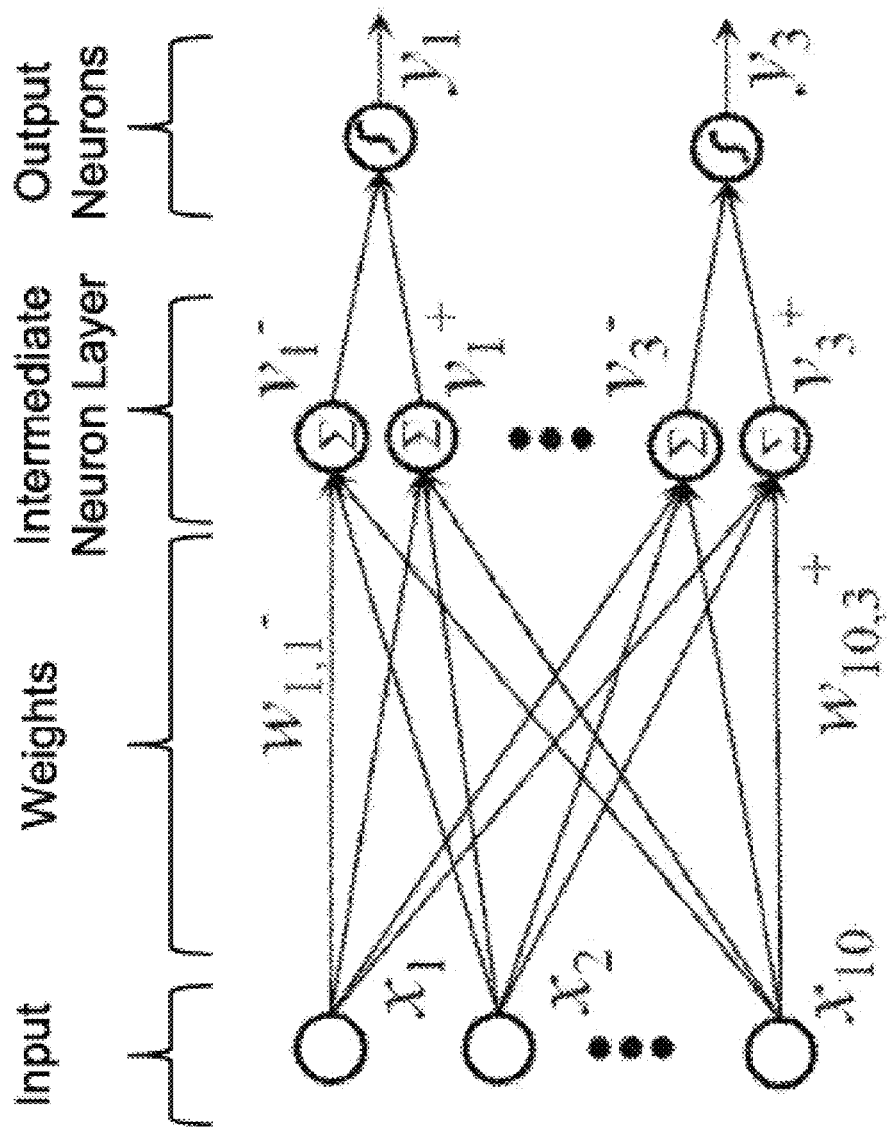
FIG. 1 is a diagram that illustrates an artificial neural network.
Figure 2:
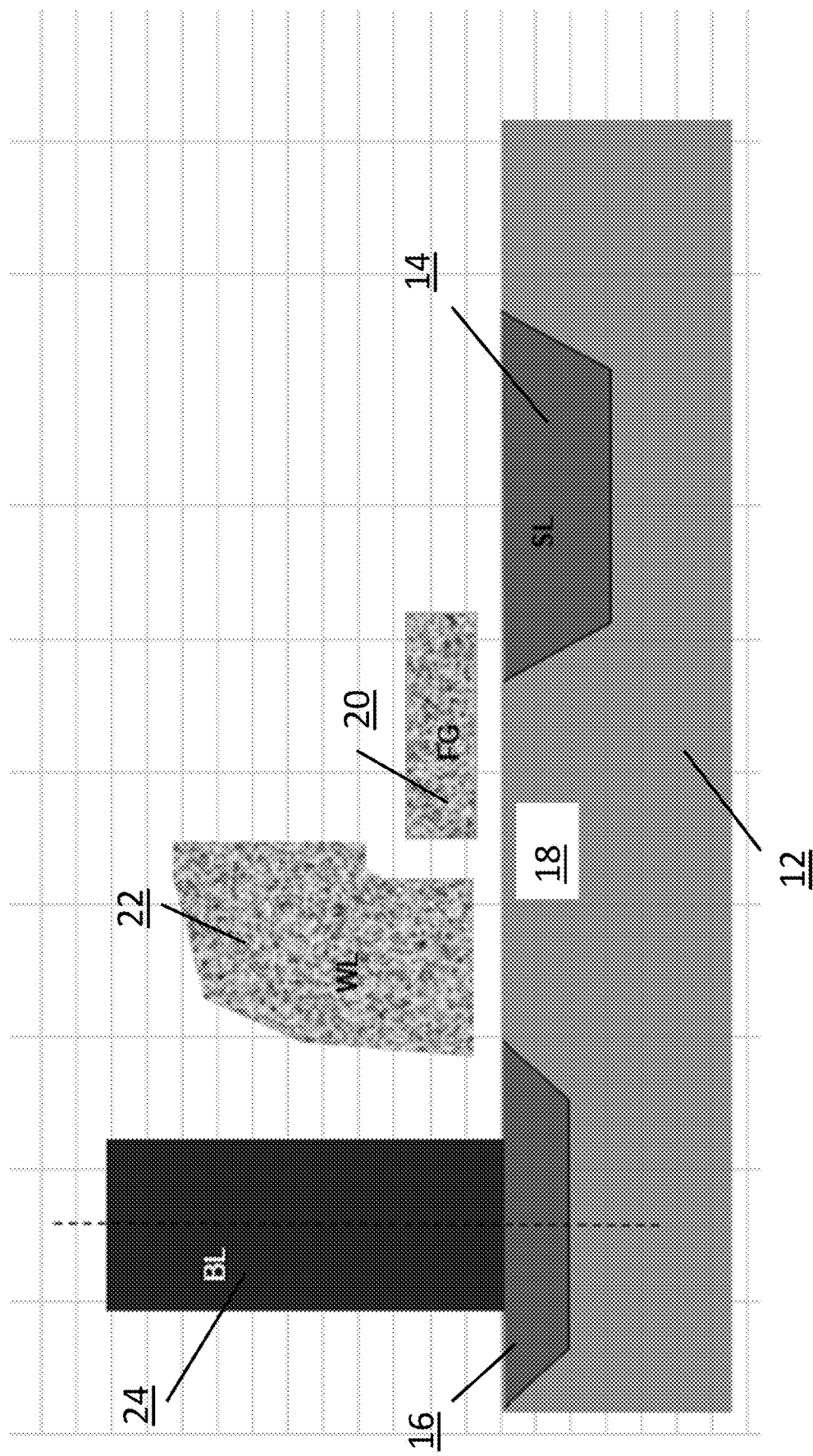
FIG. 2 is a cross-sectional side view of a conventional 2-gate non-volatile memory cell.

Digital non-volatile memories are well known. For example, U.S. Pat. No. 5,029,130 ("the '130 patent") discloses an array of split gate non-volatile memory cells, and is incorporated herein by reference for all purposes. Such a memory cell is shown in FIG. 2. Each memory cell 210 includes source region 14 and drain region 16 formed in a semiconductor substrate 12, with a channel region 18 there between. A floating gate 20 is formed over and insulated from (and controls the conductivity of) a first portion of the channel region 18, and over a portion of the source region 16. A word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim tunneling.

Memory cell 210 is programmed (where electrons are placed on the floating gate) by placing a positive voltage on the word line terminal 22, and a positive voltage on the source 16. Electron current will flow from the source 16 towards the drain 14. The electrons will accelerate and become heated when they reach the gap between the word line terminal 22 and the floating gate 20. Some of the heated electrons will be injected through the gate oxide 26 onto the floating gate 20 due to the attractive electrostatic force from the floating gate 20.

Memory cell 210 is read by placing positive read voltages on the drain 14 and word line terminal 22 (which turns on the channel region under the word line terminal). If the floating gate 20 is positively charged (i.e. erased of electrons and positively coupled to the drain 16), then the portion of the channel region under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage ranges that can be applied to the terminals of memory cell 210 for performing read, erase, and program operations:

TABLE No. 1

| Operation of Flash Memory Cell 210 of FIG. 2 | | | |
|---|---|---|---|
| | WL | BL | SL |
| Read | 2-3 V | 0.6-2 V | 0 V |
| Erase | ~11-13 V | 0 V | 0 V |
| Program | 1-2 V | 1-3 µA | 9-10 V |

Figure 3:
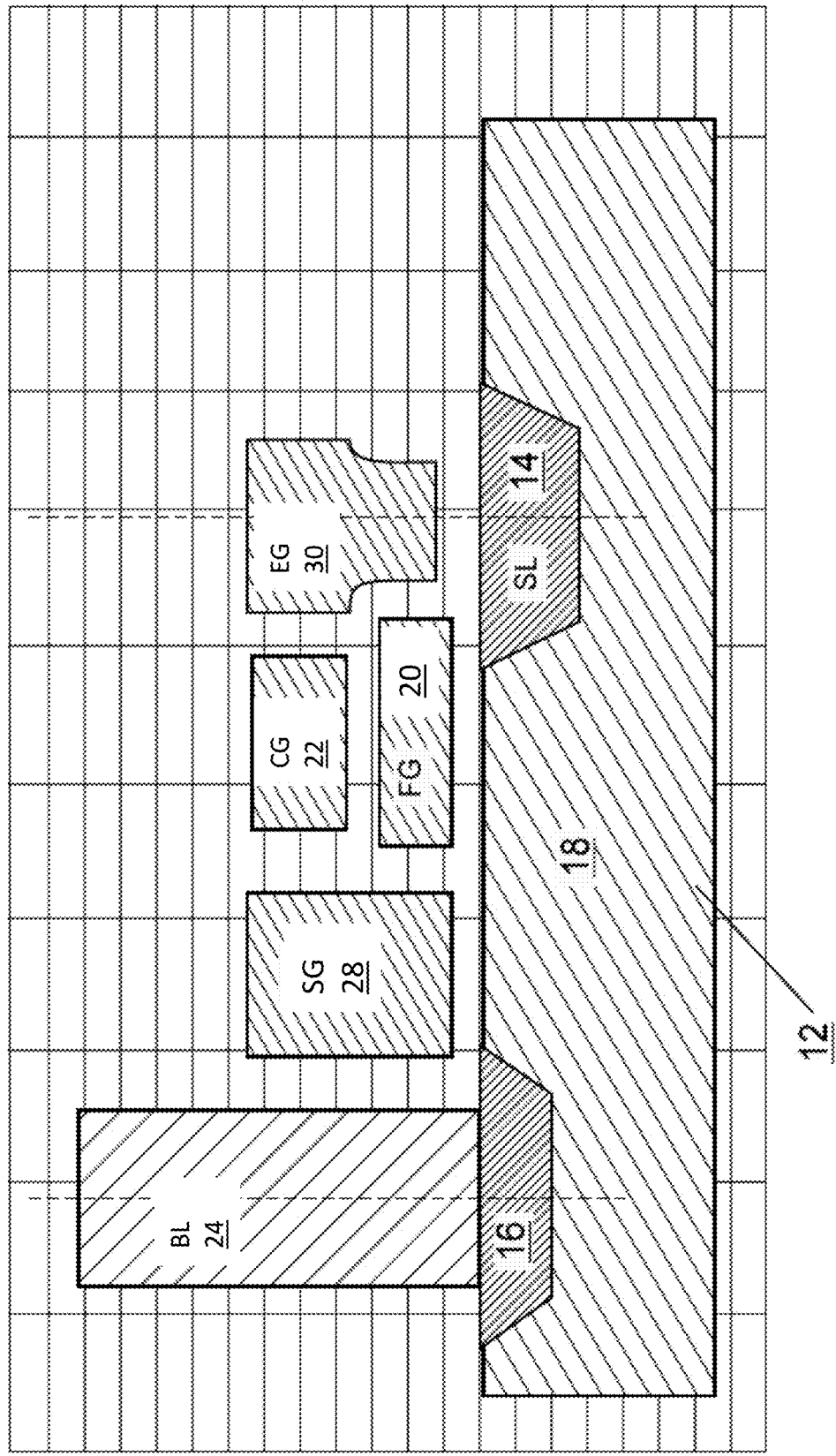
FIG. 3 is a cross-sectional side view of a conventional 4-gate non-volatile memory cell.

Other split gate memory cell configurations are known. For example, FIG. 3 depicts four-gate memory cell 310 comprising source region 14, drain region 16, floating gate 20 over a first portion of channel region 18, a select gate 28 (typically coupled to a word line) over a second portion of the channel region 18, a control gate 22 over the floating gate 20, and an erase gate 30 over the source region 14. This configuration is described in U.S. Pat. No. 6,747,310, which is incorporated herein by reference for all purposes). Here, all gates are non-floating gates except floating gate 20, meaning that they are electrically connected or connectable to a voltage source. Programming is shown by heated electrons from the channel region 18 injecting themselves onto the floating gate 20. Erasing is shown by electrons tunneling from the floating gate 20 to the erase gate 30.

Table No. 2 depicts typical voltage ranges that can be applied to the terminals of memory cell 310 for performing read, erase, and program operations:

TABLE No. 2

Operation of Flash Memory Cell 310 of FIG. 3

| | WL/SG | BL | CG | EG | SL |
|---|---|---|---|---|---|
| Read | 1.0-2 V | 0.6-2 V | 0-2.6 V | 0-2.6 V | 0 V |
| Erase | −0.5 V/0 V | 0 V | 0 V/−8 V | 8-12 V | 0 V |
| Program | 1 V | 1 µA | 8-11 V | 4.5-9 V | 4.5-5 V |

Figure 4:
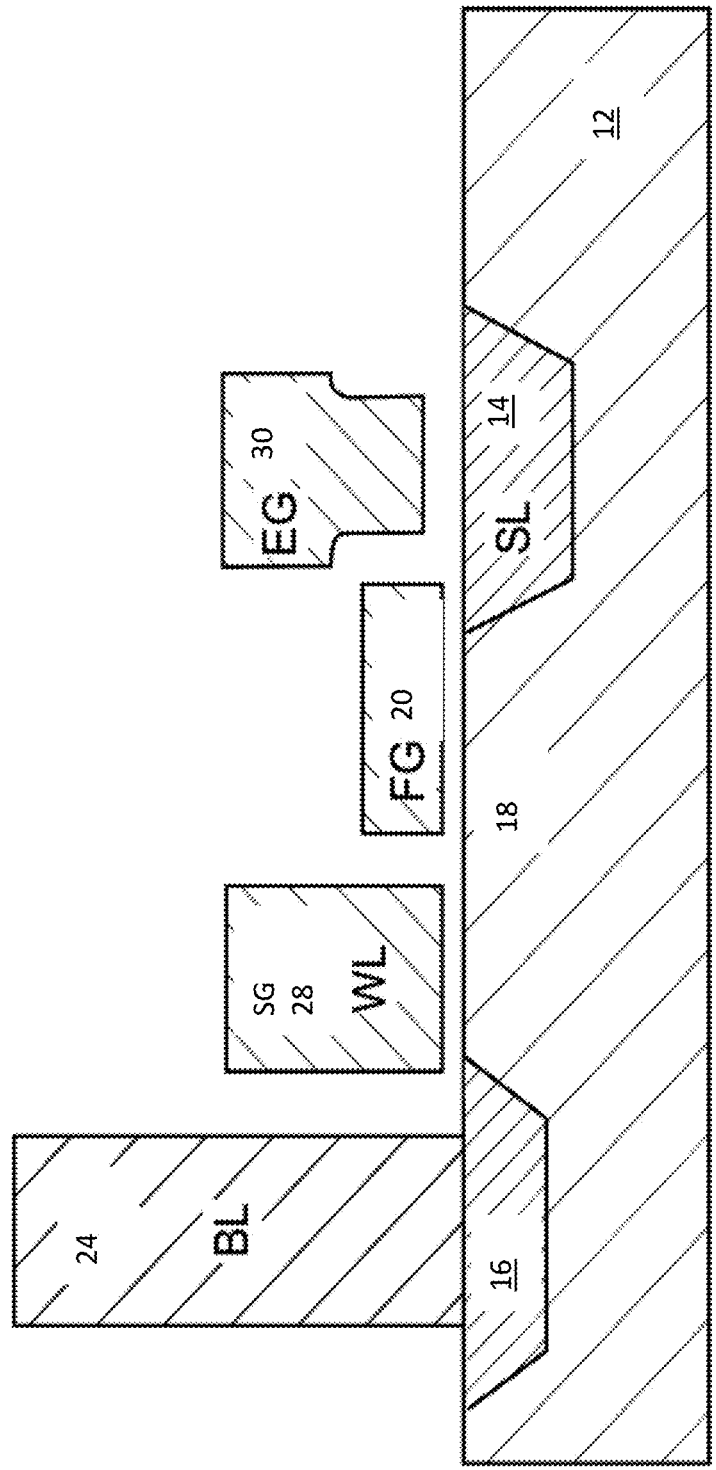
FIG. 4 is a side cross-sectional view of conventional 3-gate non-volatile memory cell.

FIG. 4 depicts split gate three-gate memory cell 410. Memory cell 410 is identical to the memory cell 310 of FIG. 3 except that memory cell 410 does not have a separate control gate. The erase operation (erasing through erase gate) and read operation are similar to that of the FIG. 3 except there is no control gate bias. The programming operation also is done without the control gate bias, hence the program voltage on the source line is higher to compensate for lack of control gate bias.

Table No. 3 depicts typical voltage ranges that can be applied to the terminals of memory cell 410 for performing read, erase, and program operations:

TABLE No. 3

Operation of Flash Memory Cell 410 of FIG. 4

| | WL/SG | BL | EG | SL |
|---|---|---|---|---|
| Read | 0.7-2.2 V | 0.6-2 V | 0-2.6 V | 0 V |
| Erase | −0.5 V/0 V | 0 V | 11.5 V | 0 V |
| Program | 1 V | 2-3 µA | 4.5 V | 7-9 V |

Figure 5:
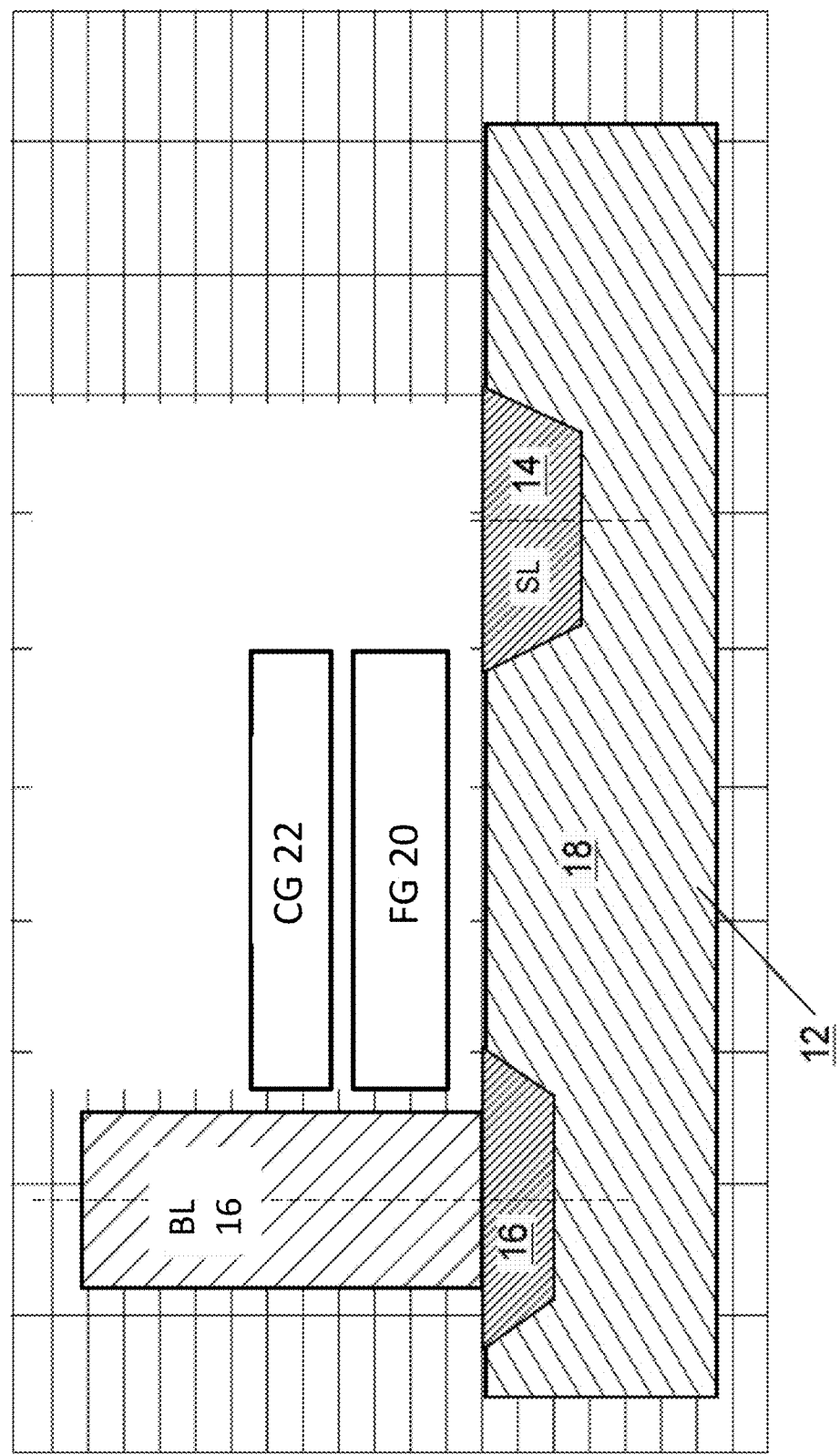
FIG. 5 is a cross-sectional side view of another conventional 2-gate non-volatile memory cell.

FIG. 5 depicts stacked gate memory cell 510. Memory cell 510 is similar to memory cell 210 of FIG. 2, except floating gate 20 extends over the entire channel region 18, and control gate 22 extends over floating gate 20, separated by an insulating layer. The erase, programming, and read operations operate in a similar manner to that described previously for memory cell 210.

Table No. 4 depicts typical voltage ranges that can be applied to the terminals of memory cell 510 for performing read, erase, and program operations:

TABLE No. 4

Operation of Flash Memory Cell 510 of FIG. 5

| | CG | BL | SL | P-sub |
|---|---|---|---|---|
| Read | 2-5 V | 0.6-2 V | 0 V | 0 V |
| Erase | −8 to −10 V/0 V | FLT | FLT | 8-10 V/15-20 V |
| Program | 8-12 V | 3-5 V | 0 V | 0 V |

In order to utilize the memory arrays comprising one of the types of non-volatile memory cells described above in an artificial neural network, two modifications are made. First, the lines are reconfigured so that each memory cell can be individually programmed, erased, and read without adversely affecting the memory state of other memory cells in the array, as further explained below. Second, continuous (analog) programming of the memory cells is provided.

Specifically, the memory state (i.e. charge on the floating gate) of each memory cells in the array can be continuously changed from a fully erased state to a fully programmed state, and vice versa, independently and with minimal disturbance of other memory cells. This means the cell storage is analog or at the very least can store one of many discrete values (such as 16 or 32 different values), which allows for very precise and individual tuning of all the cells in the memory array, and which makes the memory array ideal for storing and making fine tuning adjustments to the synapsis weights of the neural network.

Neural Networks Employing Non-Volatile Memory Cell Arrays

Figure 6:
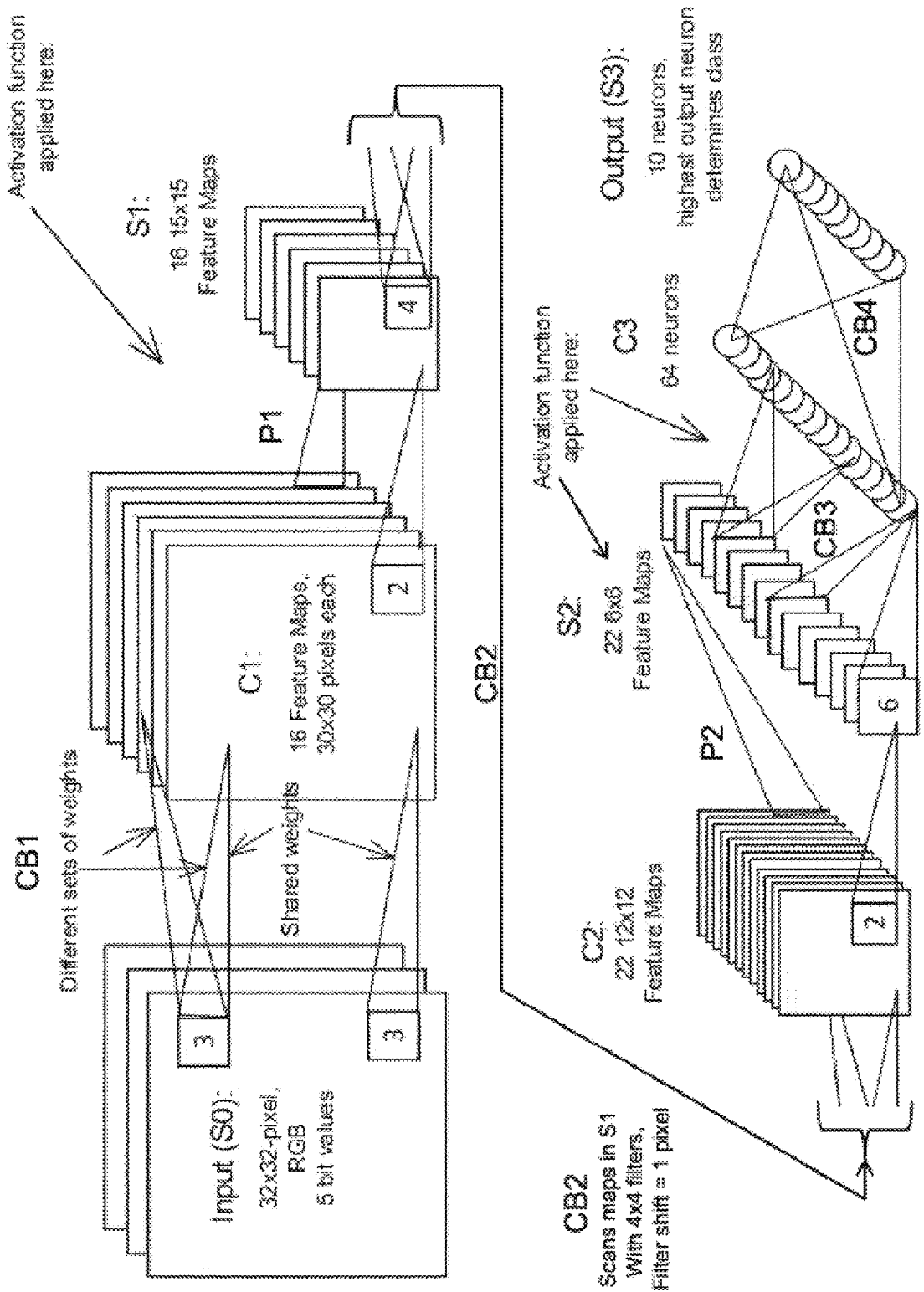
FIG. 6 is a diagram illustrating the different levels of an exemplary artificial neural network utilizing a non-volatile memory array.

FIG. 6 conceptually illustrates a non-limiting example of a neural network utilizing a non-volatile memory array. This example uses the non-volatile memory array neural net for a facial recognition application, but any other appropriate application could be implemented using a non-volatile memory array based neural network.

S0 is the input, which for this example is a 32×32 pixel RGB image with 5 bit precision (i.e. three 32×32 pixel arrays, one for each color R, G and B, each pixel being 5 bit precision). The synapses CB1 going from S0 to C1 have both different sets of weights and shared weights, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, whereby these 9 input values are multiplied by the appropriate weights and, after summing the outputs of that multiplication, a single output value is determined and provided by a first neuron of CB1 for generating a pixel of one of the layers of feature map C1. The 3×3 filter is then shifted one pixel to the right (i.e., adding the column of three pixels on the right, and dropping the column of three pixels on the left), whereby the 9 pixel values in this newly positioned filter are provided to the synapses CB1, whereby they are multiplied by the same weights and a second single output value is determined by the associated neuron. This process is continued until the 3×3 filter scans across the entire 32×32 pixel image, for all three colors and for all bits (precision values). The process is then repeated using different sets of weights to generate a different feature map of C1, until all the features maps of layer C1 have been calculated.

At C1, in the present example, there are 16 feature maps, with 30×30 pixels each. Each pixel is a new feature pixel extracted from multiplying the inputs and kernel, and therefore each feature map is a two dimensional array, and thus in this example the synapses CB1 constitutes 16 layers of two dimensional arrays (keeping in mind that the neuron layers and arrays referenced herein are logical relationships, not necessarily physical relationships—i.e., the arrays are not necessarily oriented in physical two dimensional arrays). Each of the 16 feature maps is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from C1 to S1, which pools values from consecutive, non-overlapping 2×2 regions in each feature map. The purpose of the pooling stage is to average out the nearby location (or a max function can also be used), to reduce the dependence of the edge location for example and to reduce the data size before going to the next stage. At S1, there are 16 15×15 feature maps (i.e., sixteen different arrays of 15×15 pixels each). The synapses and associated neurons in CB2 going from S1 to C2 scan maps in S1 with 4×4 filters, with a filter shift of 1 pixel. At C2, there are 22 12×12 feature maps. An activation function P2 (pooling) is applied before going from C2 to S2, which pools values from consecutive non-overlapping 2×2 regions in each feature map. At S2, there are 22 6×6 feature maps. An activation function is applied at the synapses CB3 going from S2 to C3, where every neuron in C3 connects to every map in S2. At C3, there are 64 neurons. The synapses CB4 going from C3 to the output S3 fully connects S3 to C3. The output at S3 includes 10 neurons, where the highest output neuron determines the class. This output could, for example, be indicative of an identification or classification of the contents of the original image.

Figure 7:
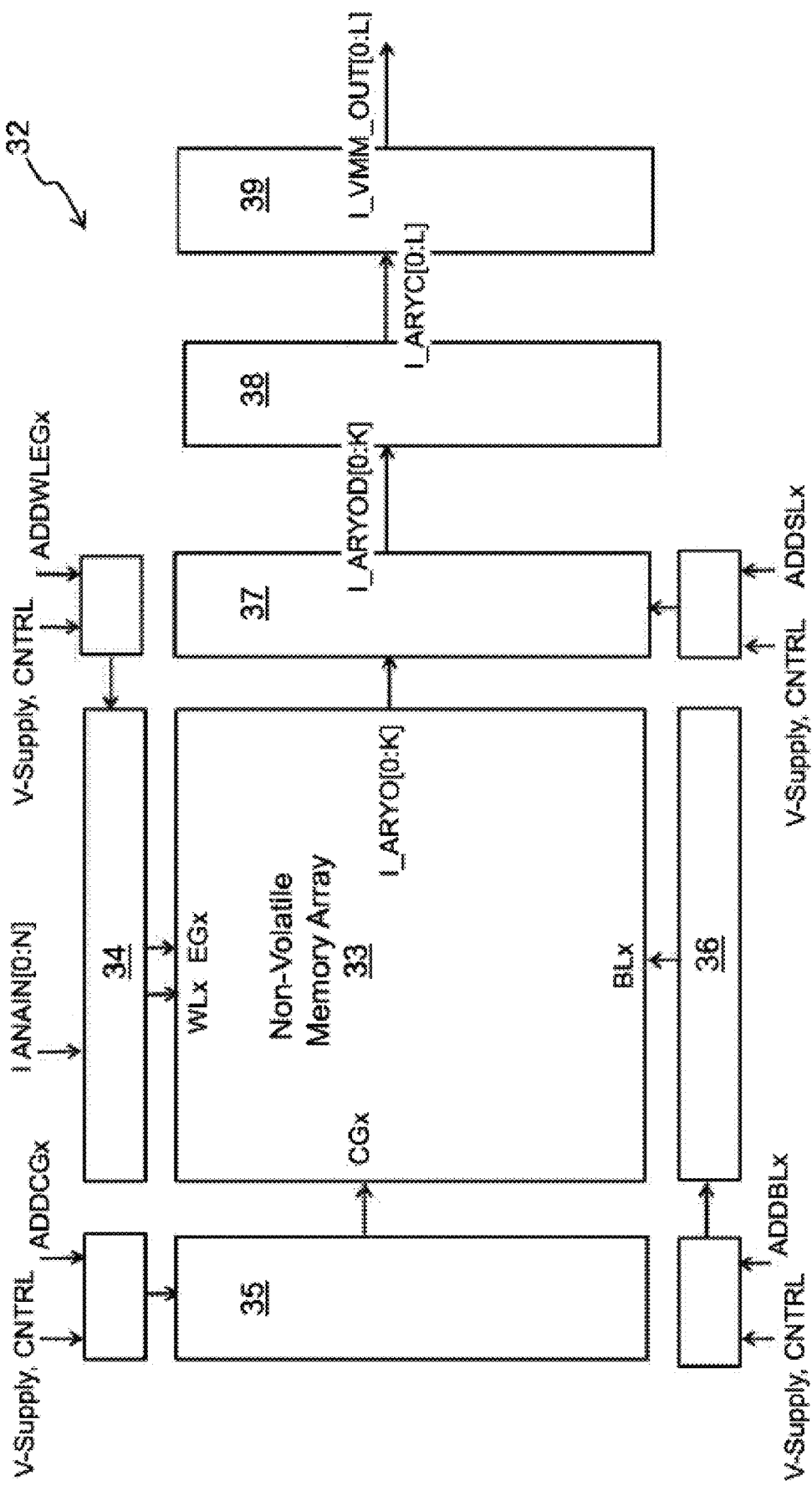
FIG. 7 is a block diagram illustrating a vector multiplier matrix.

Each level of synapses is implemented using an array, or a portion of an array, of non-volatile memory cells. FIG. 7 is a block diagram of the vector-by-matrix multiplication (VMM) array that includes the non-volatile memory cells, and is utilized as the synapses between an input layer and the next layer. Specifically, the VMM 32 includes an array of non-volatile memory cells 33, erase gate and word line gate decoder 34, control gate decoder 35, bit line decoder 36 and source line decoder 37, which decode the inputs for the memory array 33. Source line decoder 37 in this example also decodes the output of the memory cell array. The memory array serves two purposes. First, it stores the weights that will be used by the VMM. Second, the memory array effectively multiplies the inputs by the weights stored in the memory array to produce the output, which will be the input to the next layer or input to the final layer. By performing the multiplication function, the memory array negates the need for separate multiplication logic circuits and is also power efficient due to in-situ memory computation.

The output of the memory array is supplied to a differential summer (such as summing op-amp) 38, which sums up the outputs of the memory cell array to create a single value for that convolution. The differential summer is such as to realize summation of positive weight and negative weight with positive input. The summed up output values are then supplied to the activation function circuit 39, which rectifies the output. The activation function may include sigmoid, tan h, or ReLU functions. The rectified output values become an element of a feature map as the next layer (C1 in the description above for example), and are then applied to the next synapse to produce next feature map layer or final layer. The circuit 39 may further include a pooling function. Therefore, in this example, the memory array constitutes a plurality of synapses (which receive their inputs from the prior layer of neurons or from an input layer such as an image database), and summing op-amp 38 and activation function circuit 39 constitute a plurality of neurons.

Figure 8:
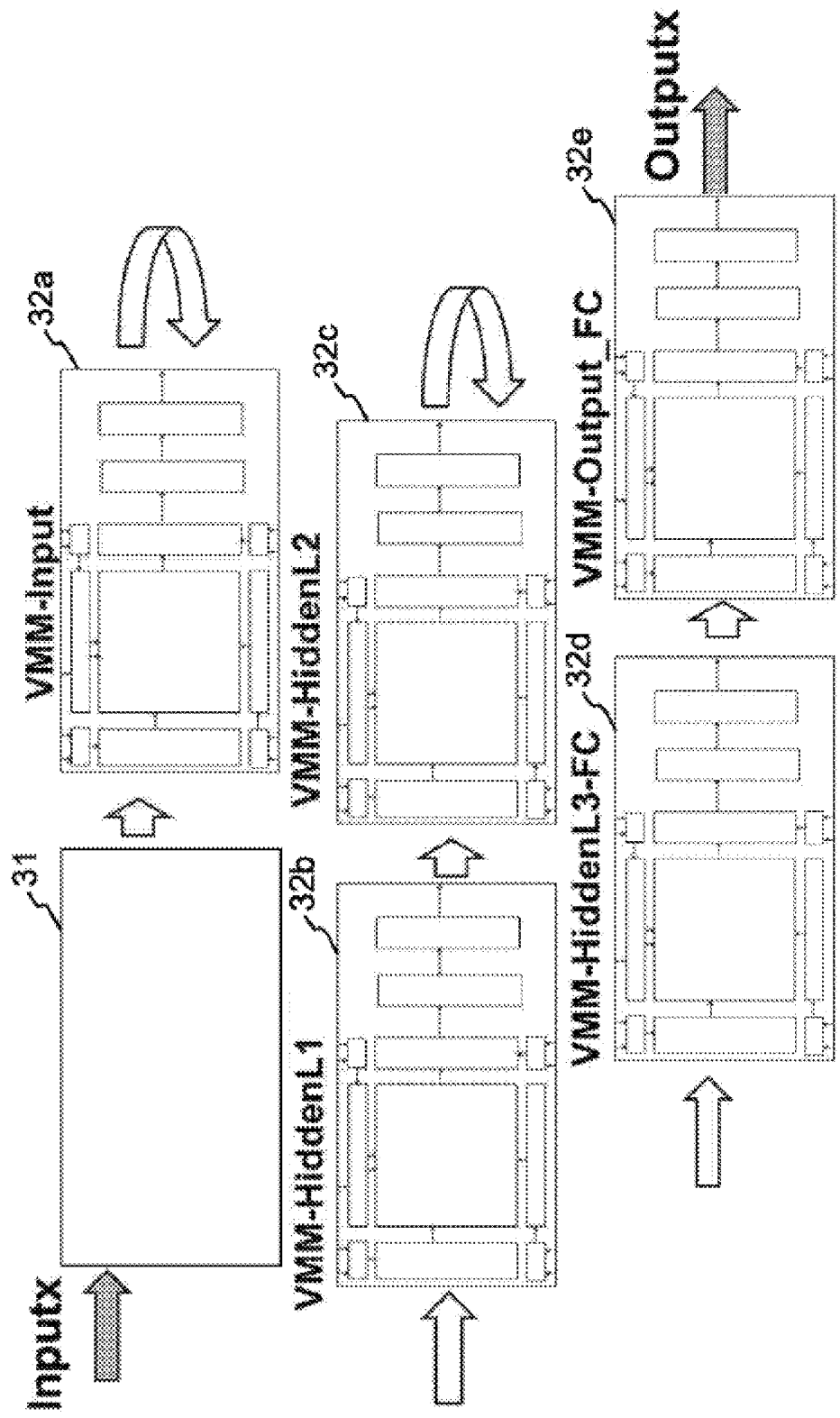
FIG. 8 is a block diagram illustrating various levels of a vector multiplier matrix.

FIG. 8 is a block diagram of the various levels of VMM. As shown in FIG. 7, the input is converted from digital to analog by digital-to-analog converter 31, and provided to input VMM 32a. The output generated by the input VMM 32a is provided as an input to the next VMM (hidden level 1) 32b, which in turn generates an output that is provided as an input to the next VMM (hidden level 2) 32c, and so on for VMM 32d and 32e. The various layers of VMM's 32 function as different layers of synapses and neurons of a convolutional neural network (CNN). Each VMM can be a stand-alone non-volatile memory array, or multiple VMMs could utilize different portions of the same non-volatile memory array, or multiple VMMs could utilize overlapping portions of the same non-volatile memory array. As shown in FIG. 8 there are 5 layers, other combinations of hidden layers and fully connected layers more than 5 layers are possible.

Vector-by-Matrix Multiplication (VMM) Arrays

Figure 9:
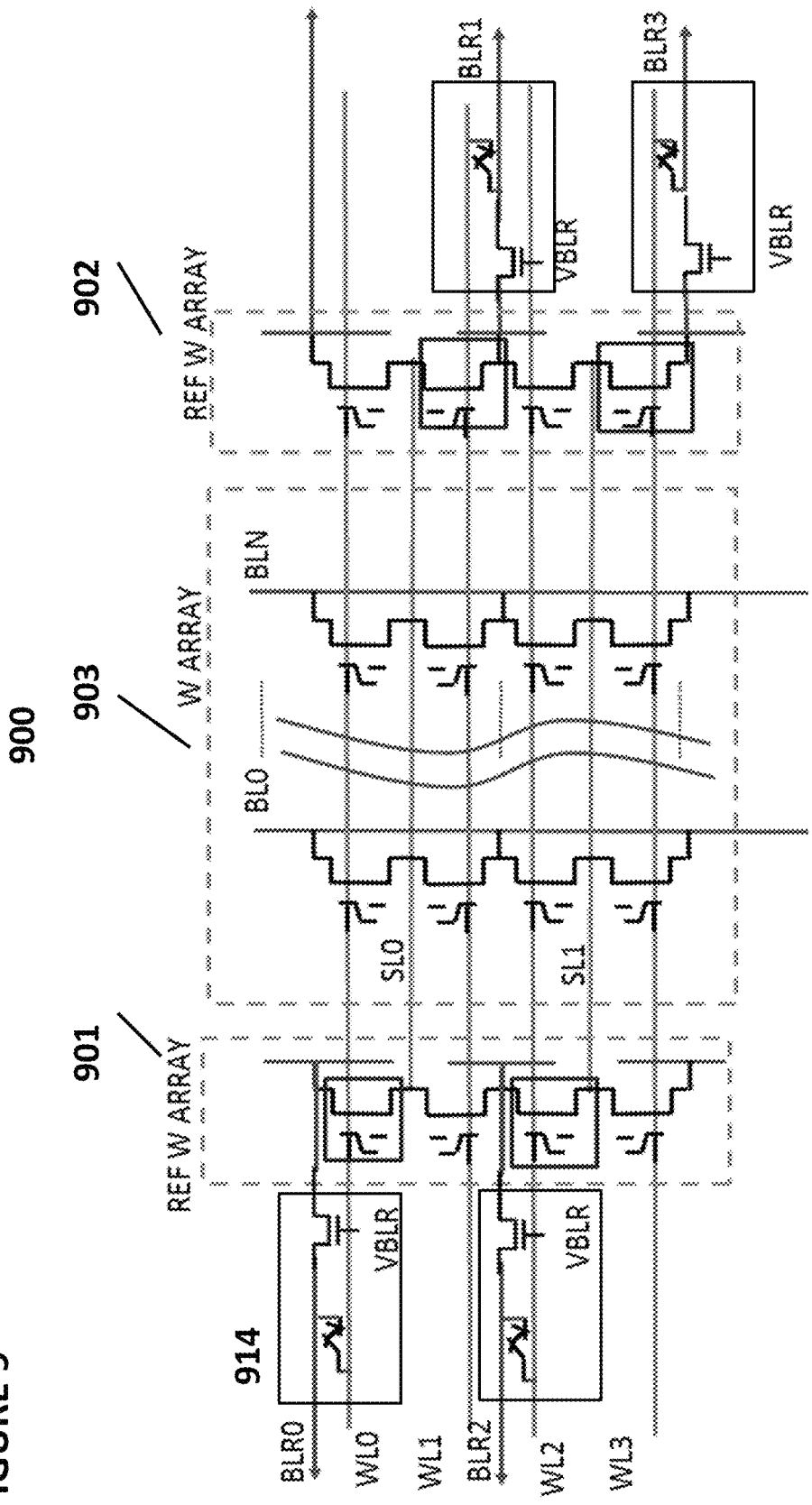
FIG. 9 depicts an array of non-volatile memory cells for use in an artificial neural network.

FIG. 9 depicts neuron VMM 900, which is particularly suited for memory cells of the type shown in FIG. 2, and is utilized as the synapses and parts of neurons between an input layer and the next layer. VMM 900 comprises a memory array 903 of non-volatile memory cells, reference array 901, and reference array 902. Reference arrays 901 and 902 serve to convert current inputs flowing into terminals BLR0-3 into voltage inputs WL0-3. Reference arrays 901 and 902 as shown are in the column direction. In general, the reference array direction is orthogonal to the input lines. In effect, the reference memory cells are diode connected through multiplexors (multiplexor 914, which includes a multiplexor and a cascoding transistor VBLR for biasing the reference bit line) with current inputs flowing into them. The reference cells are tuned to target reference levels.

Memory array 903 serves two purposes. First, it stores the weights that will be used by the VMM 900. Second, memory array 903 effectively multiplies the inputs (current inputs provided in terminals BLR0-3; reference arrays 901 and 902 convert these current inputs into the input voltages to supply to wordlines WL0-3) by the weights stored in the memory array to produce the output, which will be the input to the next layer or input to the final layer. By performing the multiplication function, the memory array negates the need for separate multiplication logic circuits and is also power efficient. Here, the voltage inputs are provided on the word lines, and the output emerges on the bit line during a read (inference) operation. The current placed on the bit line performs a summing function of all the currents from the memory cells connected to the bitline.

FIG. 10 depicts typical voltage ranges that can be applied to the terminals of memory cells within VMM 900 for performing read, erase, and program operations. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

Figure 11:
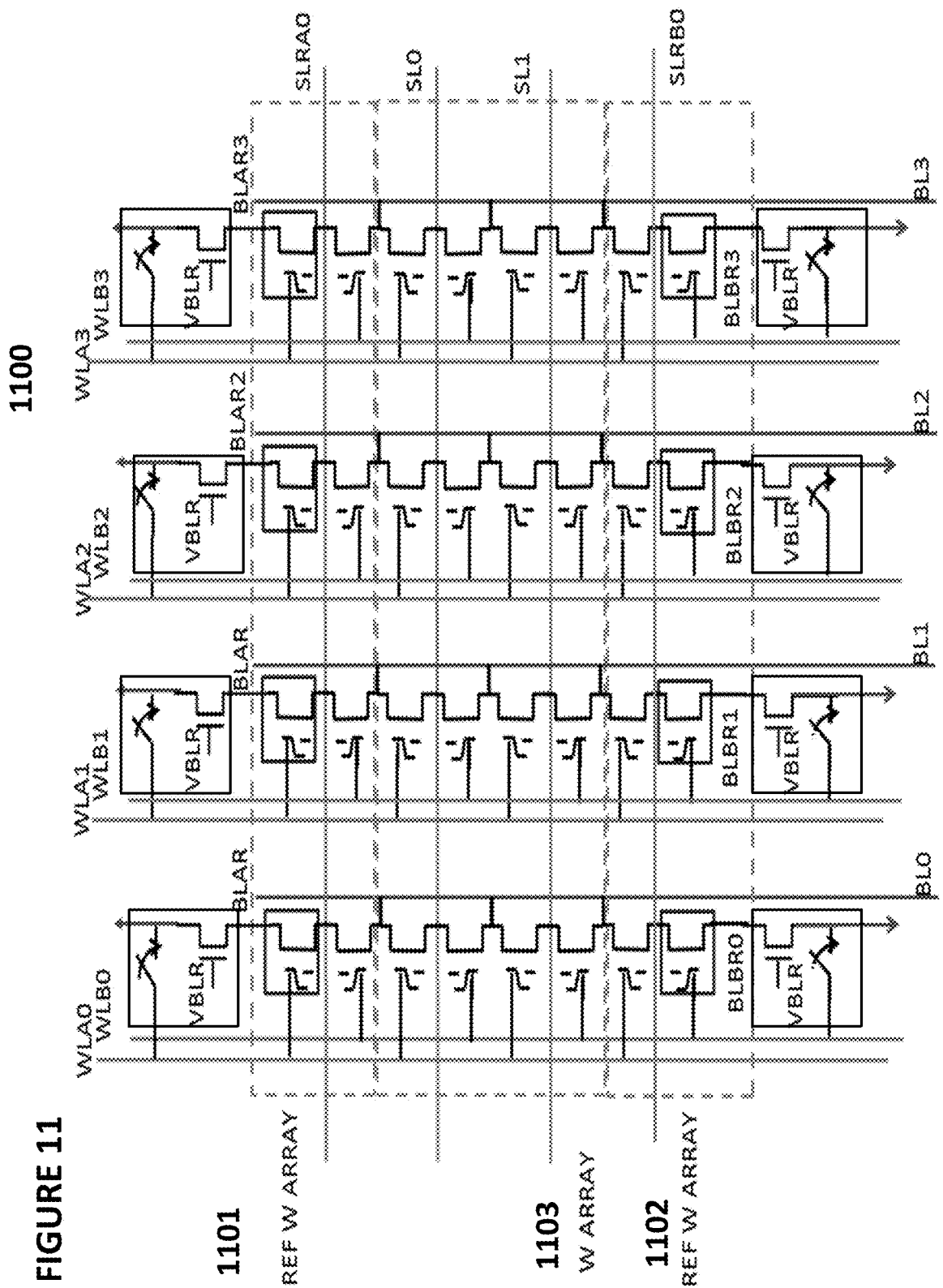
FIG. 11 depicts an array of non-volatile memory cells for use in an artificial neural network.

FIG. 11 depicts neuron VMM 1100, which is particularly suited for memory cells of the type shown in FIG. 2, and is utilized as the synapses and parts of neurons between an input layer and the next layer. VMM 1100 comprises a memory array 1103 of non-volatile memory cells, reference array 1101, and reference array 1102. VMM 1100 is similar to VMM 1100 except that in VMM 1100 the word lines run in the vertical direction. There are two reference arrays 1101 (at the top, which provides a reference converting input current into voltage for the even rows) and 1102 (at the bottom, which provides a reference converting input current into voltage for the odd rows). Here, the inputs are provided on the word lines, and the output emerges on the source line during a read operation. The current placed on the source line performs a summing function of all the currents from the memory cells connected to the source line.

Memory array 1103 serves two purposes. First, it stores the weights that will be used by the VMM 1100. Second, memory array 1103 effectively multiplies the inputs (current inputs provided to terminals BLR0-3; reference arrays 1101 and 1102 convert these current inputs into the input voltages to supply to the control gates CG0-3) by the weights stored in the memory array to produce the output, which will be the input to the next layer or input to the final layer. By performing the multiplication function, the memory array negates the need for separate multiplication logic circuits and is also power efficient. Here, the inputs are provided on the word lines, and the output emerges on the source line during a read operation. The current placed on the source line performs a summing function of all the currents from the memory cells connected to the source line.

FIG. 12 depicts typical voltage ranges that can be applied to the terminals of memory cells within WM 1100 for performing read, erase, and program operations. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

Figure 13:
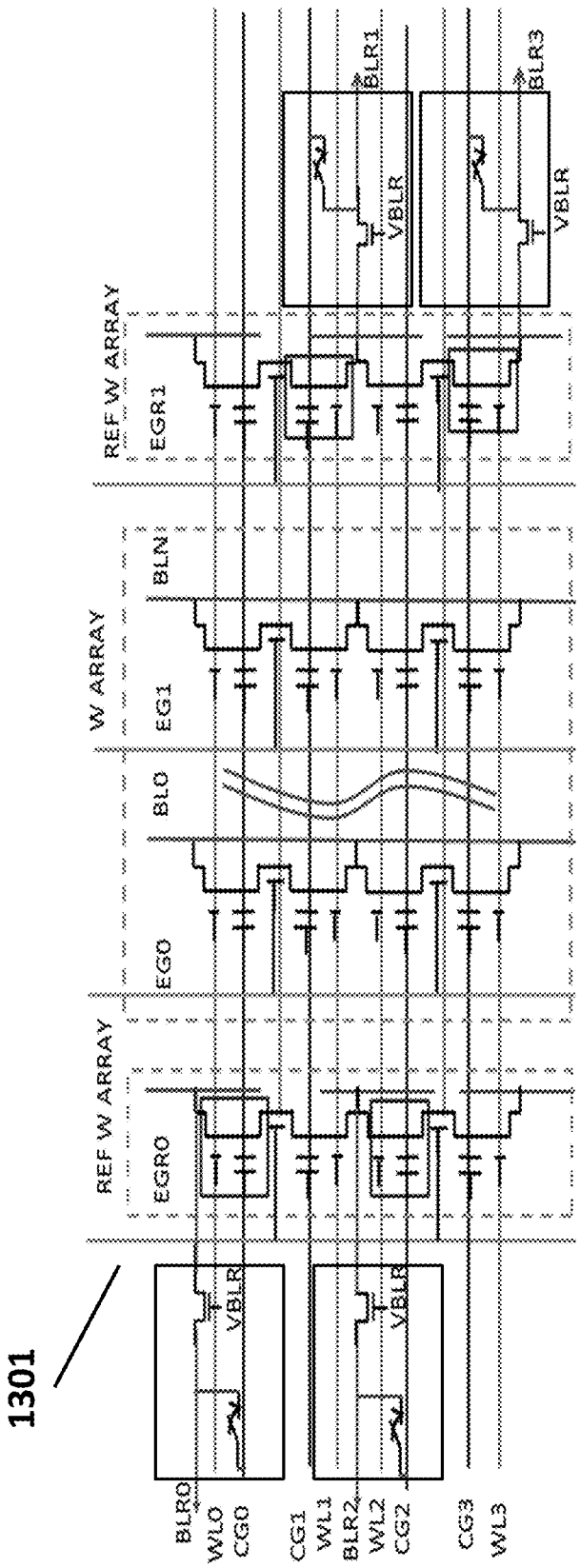
FIG. 13 depicts an array of non-volatile memory cells for use in an artificial neural network.

FIG. 13 depicts neuron VMM 1300, which is particularly suited for memory cells of the type shown in FIG. 3, and is utilized as the synapses and parts of neurons between an input layer and the next layer. VMM 1300 is similar to VMM 900, except in VMM 1300, erase gate lines such as erase gate line 1301 run in a vertical direction. Here, the inputs are provided on the control gate lines, and the output emerges on the bit lines. The current placed on the bit line performs a summing function of all the currents from the memory cells connected to the bit line.

Memory array 1301 serves two purposes. First, it stores the weights that will be used by the VMM 1300. Second, memory array 1301 effectively multiplies the inputs (current inputs provided to terminals BLR0-3; reference arrays 1301 and 1302 convert these current inputs into the input voltages to supply to the control gates CG0-3) by the weights stored in the memory array to produce the output, which will be the input to the next layer or input to the final layer. By performing the multiplication function, the memory array negates the need for separate multiplication logic circuits and is also power efficient. Here, the inputs are provided on the control gate lines, and the output emerges on the bitline during a read operation. The current placed on the bitline performs a summing function of all the currents from the memory cells connected to the bitline. Alternatively the inputs can be provided to the word lines.

VMM 1300 implements uni-directional tuning for memory cells in memory array 1303. That is, each cell is erased and then partially programmed until the desired charge on the floating gate is reached. If too much charge is placed on the floating gate (such that the wrong value is stored in the cell), the cell must be erased and the sequence of partial programming operations must start over. As shown, two rows sharing the same erase gate need to be erased together (to be known as a page erase), and thereafter, each cell is partially programmed until the desired charge on the floating gate is reached, FIG. 14 depicts operating voltages for VMM 1300. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

Figure 15:
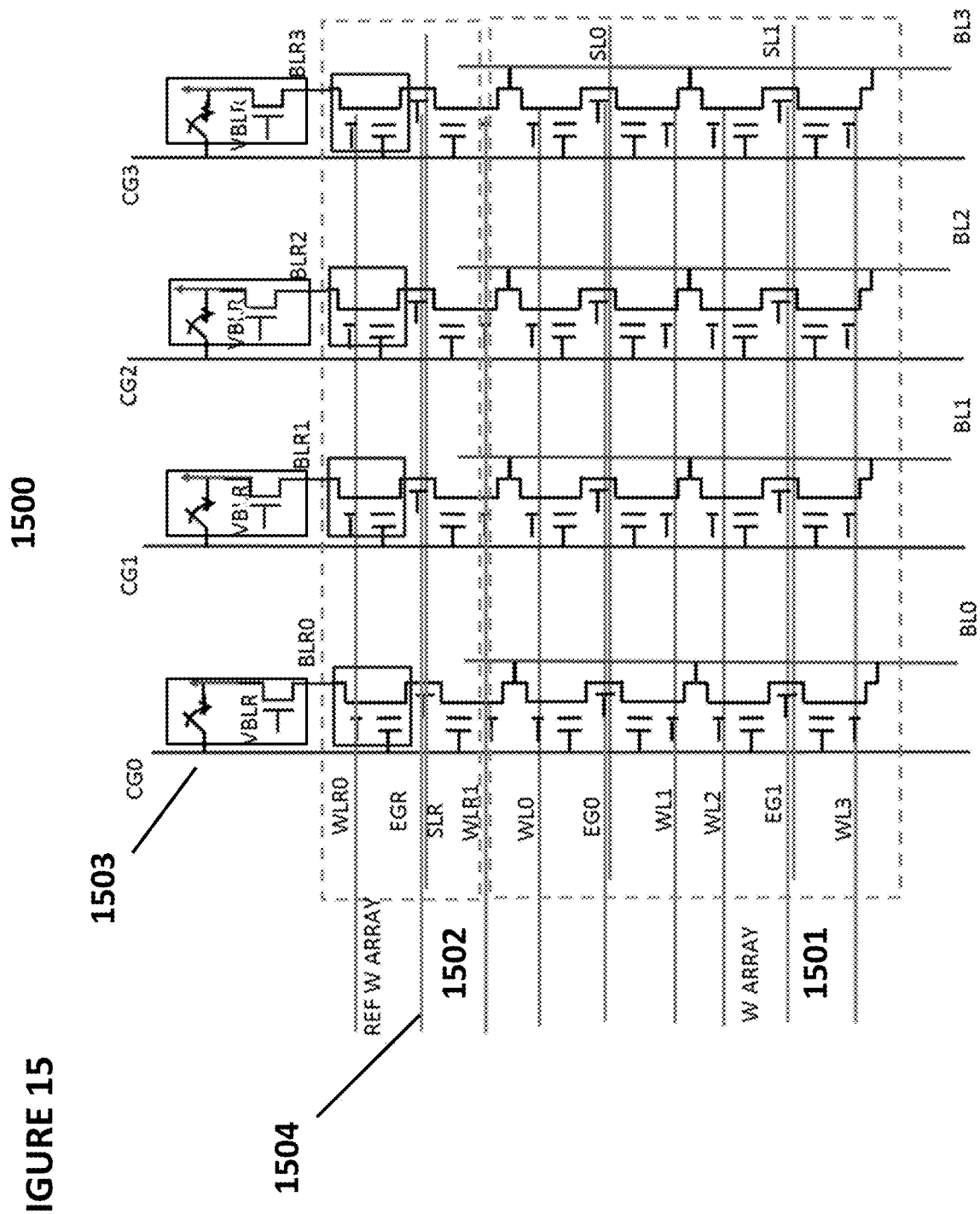
FIG. 15 depicts an array of non-volatile memory cells for use in an artificial neural network.

FIG. 15 depicts neuron VMM 1500, which is particularly suited for memory cells of the type shown in FIG. 3, and is utilized as the synapses and parts of neurons between an input layer and the next layer. VMM 1500 comprises a memory array 1501 of non-volatile memory cells and reference array 1502 (at the top of the array). Alternatively, another reference array can be placed at the bottom, similar to that of FIG. 10. In other respects, VMM 1500 is similar to VMM 1500, except in VMM 1500, control gates line such as control gate line 1503 run in a vertical direction (hence reference array 1502 in the row direction, orthogonal to the input control gate lines), and erase gate lines such as erase gate line 1504 run in a horizontal direction. Here, the inputs are provided on the control gate lines, and the output emerges on the source lines. In one embodiment only even rows are used, and in another embodiment, only odd rows are used. The current placed on the source line performs a summing function of all the currents from the memory cells connected to the source line.

Other embodiments for the ESF vector matrix multiplier are as described in U.S. patent application Ser. No. 15/826, 345, which is incorporated by reference herein. A sourceline or a bitline can be used as the neuron output (current summation output).

FIG. 16 depicts operating voltages for VMM 1500. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

As described herein for neural networks, the flash cells are preferably configured to operate in sub-threshold region.

The memory cells described herein are biased in weak inversion:

$$Ids = Io*e^{(Vg-Vth)}kVt = w*Io*e^{(Vg)/kVt}$$

$$w = e^{(-Vth)/kVt}$$

For I-to-V log converter using a memory cell to convert input current into an input voltage:

$$Vg = k*Vt*\log[Ids/wp*Io]$$

For a memory array used as a vector matrix multiplier VMM, the output current is:

$$Iout = wa*Io*e^{(Vg)/kVt}, \text{ namely}$$

$$Iout = (wa/wp)*Iin = W*Iin$$

$$W = e^{(Vthp-Vtha)/kVt}$$

Alternatively, the flash memory cells can be configured to operate in the linear region:

$$Ids = \text{beta}*(Vgs-Vth)*Vds; \text{ beta} = u*Cox*W/L$$

$$W\alpha(Vgs-Vth)$$

For an I-to-V linear converter, a memory cell operating in the linear region can be used to convert linearly an input/output current into an input/output voltage.

Other embodiments for the ESF vector matrix multiplier are as described in U.S. patent application Ser. No. 15/826, 345, which is incorporated by reference herein. A sourceline or a bitline can be used as the neuron output.

Summer and Activation Function Circuits

Figure 17:
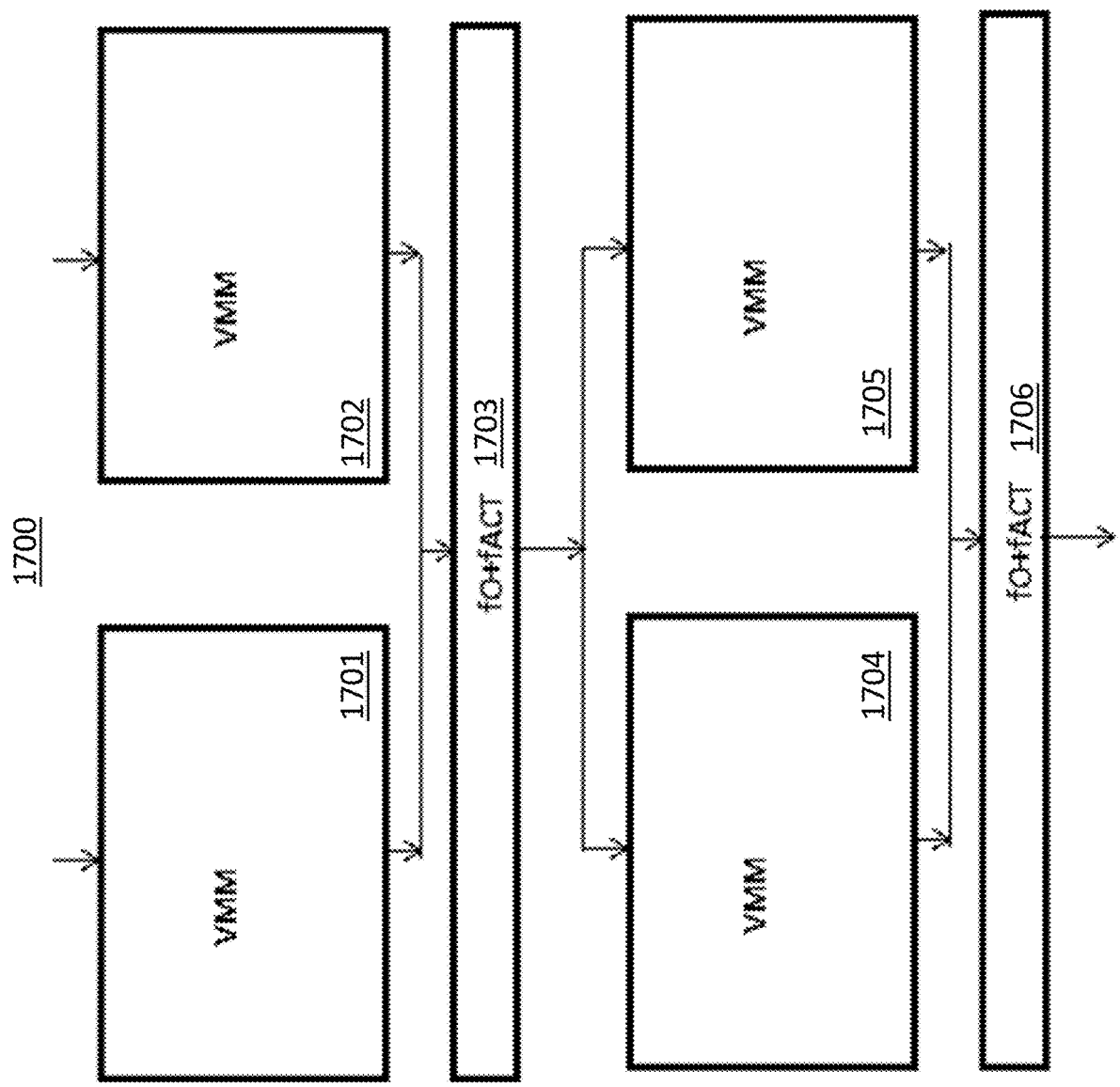
FIG. 17 depicts VMM arrays coupled to summer and activation function circuits.

FIG. 17 depicts two stages of neuron VMMs followed by summer and activation function circuits. System 1700 comprises VMM arrays 1701, 1702, 1704, and 1705. VMM arrays 1701 and 1702 share neuron output circuit 1703 (comprising a summer circuit and an activation function circuit), and VMM arrays 1704 and 1705 share neuron output circuit 1706 (comprising a summer circuit and an activation function circuit). The output of VMM array 1701 and the output of VMM 1702 are provided at different times (for example, in a time-multiplexed activation scheme) to neuron output circuit 1703. Neuron output circuit 1703 first sums up the output current of VMM 1701 or 1702 to create a single value for that convolution, thereby realizing a summation of positive weight and negative weight with positive input. The summed up output values are then supplied to the activation function circuit, which rectifies the output. The activation function may include sigmoid, tan h, or ReLU functions. The rectified output values become an element of a feature map as the next layer, and are then applied to the next synapse—here VMM array 1704 or VMM array 1705—to produce next feature map layer or final layer. Each VMM can follow one of the VMM designs described previously with reference to FIGS. 9, 11, 13, and 15.

The output of VMM array 1704 and the output of VMM 1705 are provided at different times (for example, in a time-multiplexed fashion) to neuron output circuit 1706. Neuron output circuit 1706 first sums up the output current of VMM 1704 or 1705 to create a single value for that convolution, thereby realizing a summation of positive weight and negative weight with positive input. The summed up output values are then supplied to the activation function circuit, which rectifies the output. The activation function may include sigmoid, tan h, or ReLU functions. The rectified output values become an element of a feature map as the next layer or represent the final result, and are then applied to the next synapse, if one exists, to produce the next feature map layer or final layer.

The size of various VMM arrays shown in the above-described figures depends on architecture and convolution operation factors such as layer depth (input, hidden, output), filter size, pooling size, feature map size and depth, etc. The size also depends on whether input or output time-multiplexing is used.

Figure 18:
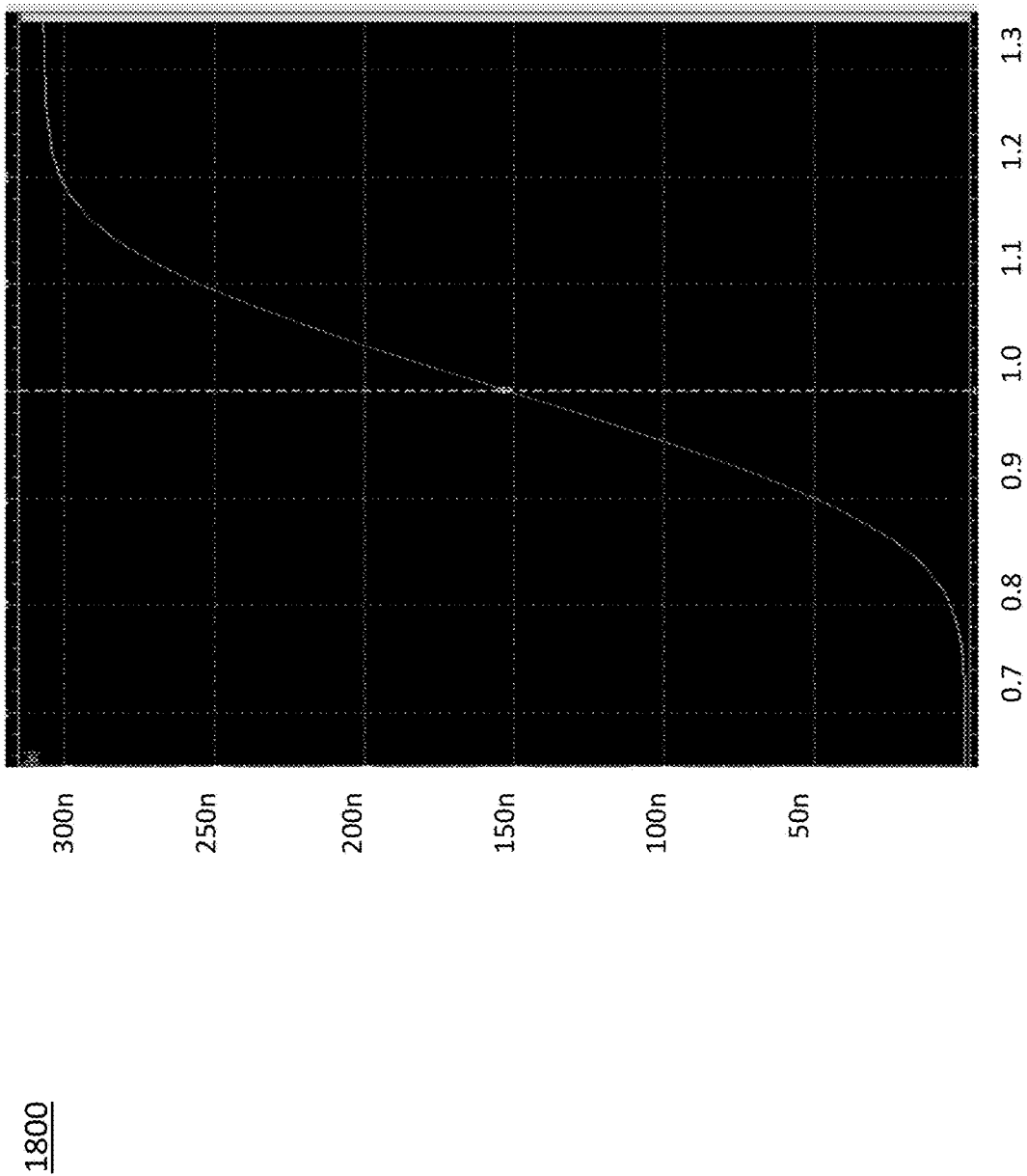
FIG. 18 depicts a plot of the input-output characteristics of the activation function circuits from FIG. 17.

FIG. 18 depicts plot 1800 of the activation function performed by neuron output circuits 1703 or 1706. In this example, the activation function is a tan h function (hyperbolic tangent function).

Figure 19:
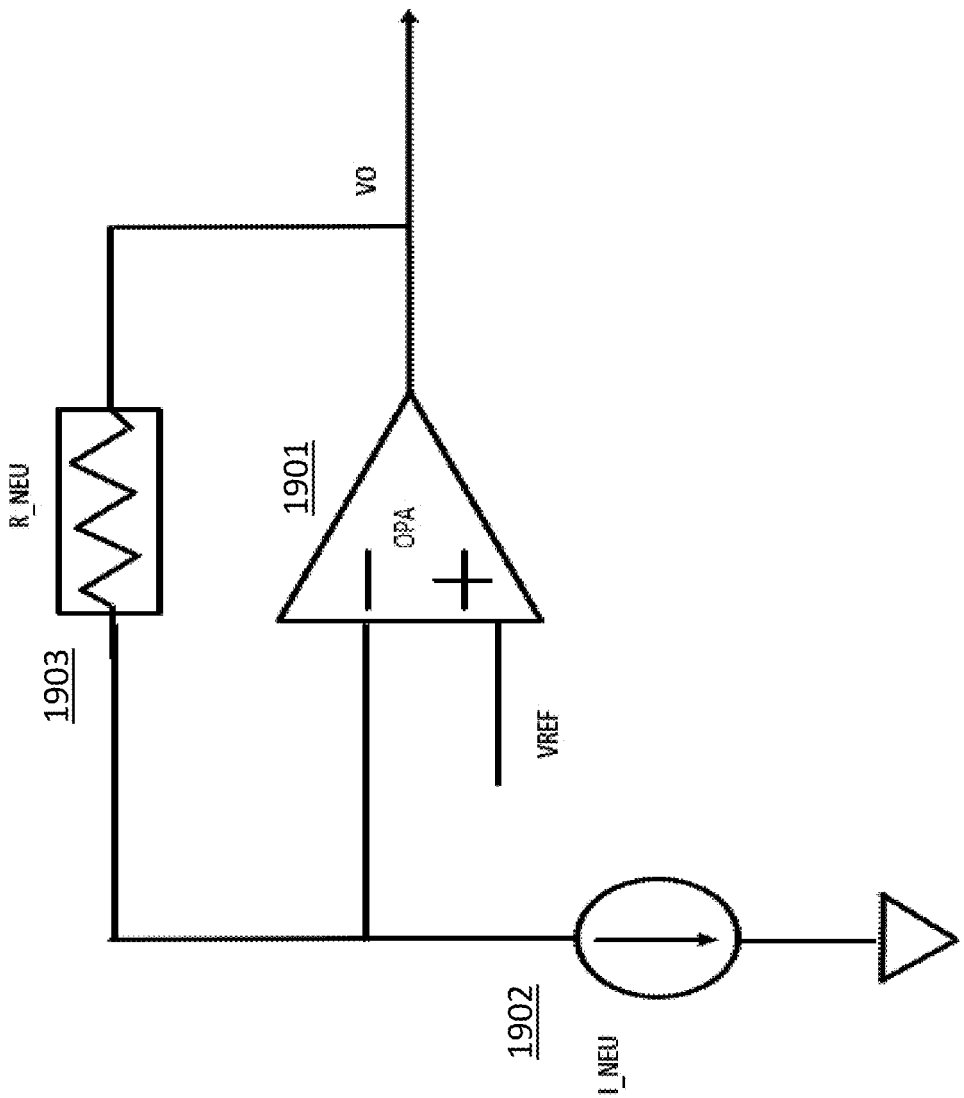
FIG. 19 depicts a prior art summer circuit

FIG. 19 depicts prior art neuron circuit 1900 that is a current summer and converts a current signal into a voltage signal. Here, neuron circuit 1900 receives current from a VMM, such as VMM 1701, 1702, 1704, or 1705 (labeled I_NEU), which here is represented as current source 1902, which is coupled to the inverting input of operational amplifier 1901. The non-inverting input of operational amplifier 1901 is coupled to a voltage source (labeled VREF). The output (labeled VO) of operational amplifier 1901 is coupled to resistor 1903 (labeled R_NEU), which is then coupled to current source 1902 and the inverting input of operational amplifier 1901. The output voltage, VO, is equal to the current I_NEU*R_NEU. The maximum value of I_NEU depends on the number of synapses and weight value contained in the VMM. Notably, R_NEU is a fixed resistance, and as I_NEU increases, VO and overall power consumption also will increase.

Figure 20:
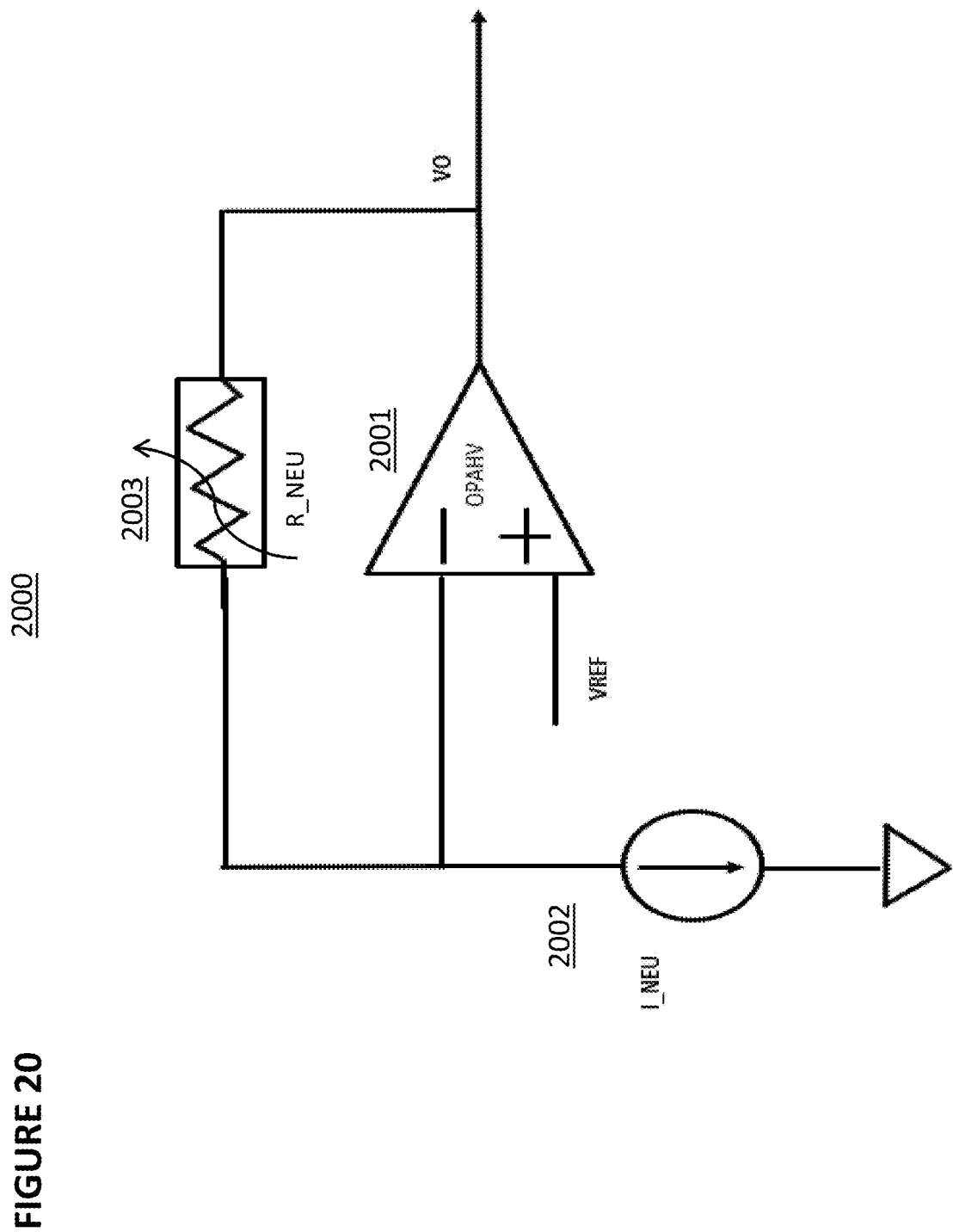
FIG. 20 depicts an embodiment of an adjustable summer circuit.

FIG. 20 depicts neuron circuit 2000 for summing a current and converting the summed current signal into a voltage signal. Neuron circuit 2000 receives current from a VMM, such as VMM 1701, 1702, 1704, or 1705 (labeled I_NEU), which here is represented as current source 2002, which is provided to the inverting input of operational amplifier 2001. The non-inverting input of operational amplifier 2001 is coupled to a voltage source (labeled VREF). The output (labeled VO) of operational amplifier 2001 is coupled to variable resistor 2003 (labeled R_NEU), which is then coupled to current source 2002 and the inverting input of operational amplifier 2001. The output voltage, Vo, is equal to the current I_NEU*R_NEU-VREF. The maximum value of I_NEU depends on the number of synapses and weight value contained in the VMM. Unlike in the design of FIG. 19, R_NEU is a variable resistance and can be adapted to the VMM that provides current I_NEU. For example, the resistance R_NEU can be configured or trimmed to minimize power based on the average or peak current in I_NEU.

Figure 21:
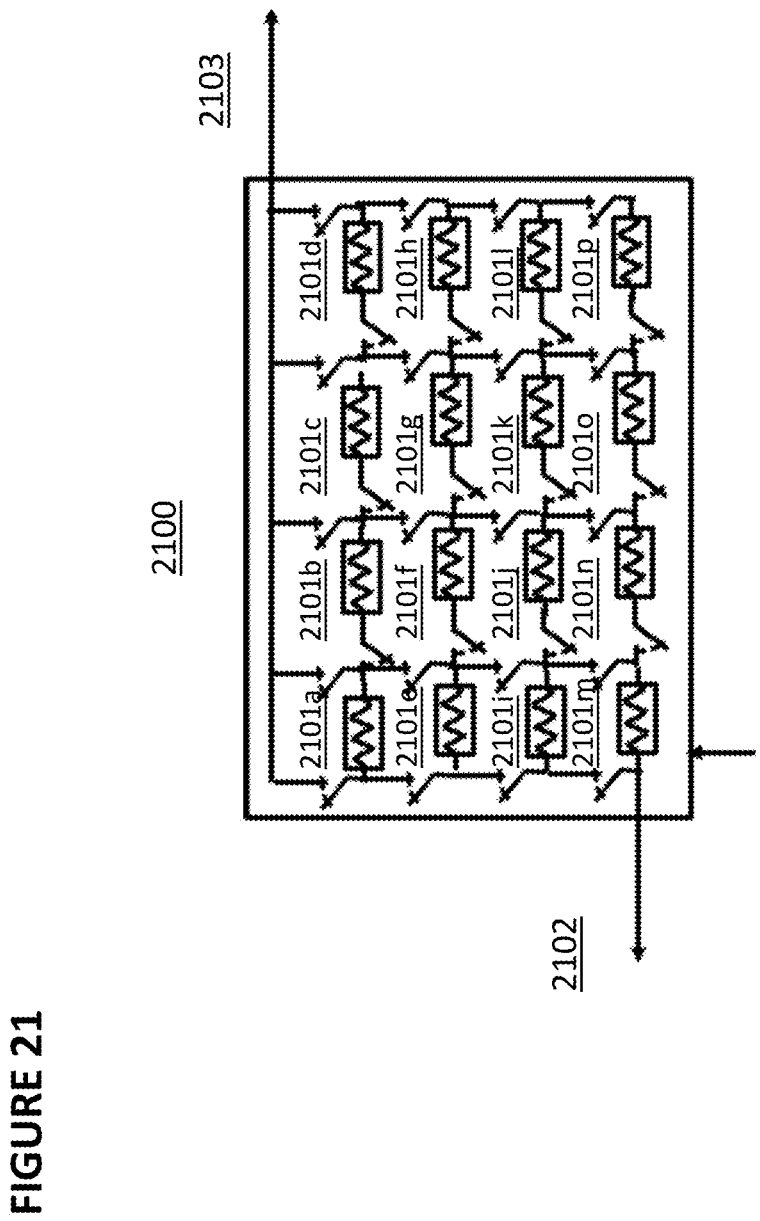
FIG. 21 depicts an embodiment of a variable resistor.

FIG. 21 depicts an embodiment of variable resistor 2100. Variable resistor 2100 comprises first terminal 2102 and second terminal 2103. Variable resistor 2103 can be configured to couple one or more of discrete resistors 2101a, 2101b, . . . 2101p between first terminal 2102 and second terminal 2103, thereby configuring the overall resistance (R_NEU) of variable resistor 2100. Optionally, this can be performed during a configuration or trimming stage.

Figure 22:
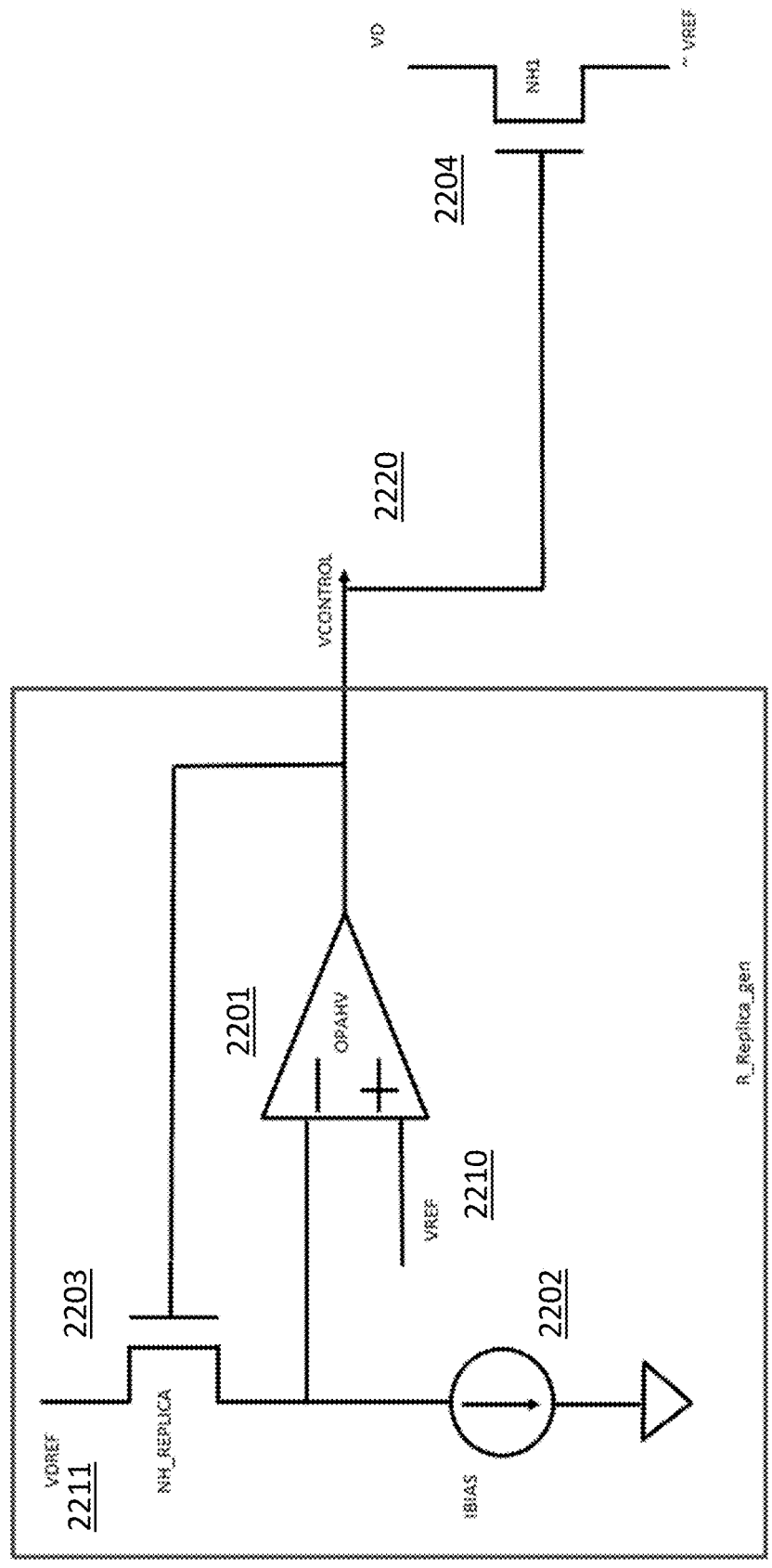
FIG. 22 depicts an embodiment of a control circuit.

FIG. 22 depicts neuron control circuit 2200 for generating a control signal, VCONTROL to control continuous variable resistance MOS transistor served to replace the variable resistor 2103 of FIG. 21. Neuron control circuit 2200 comprises operational amplifier 2201. The inverting input of operational amplifier 2201 is coupled to current bias source 2202 (generating IBIAS) and to the source of NMOS R-replica (replicating a resistance) transistor 2203, which operates in linear region. The drain of NMOS R-replica transistor 2203 is coupled to a voltage source VDREF 2211. The non-inverting input of operational amplifier 2201 is coupled to a voltage source (labeled VREF 2210). The output 2220 (labeled VCONTROL) of operational amplifier 2201 is coupled to the gate of NMOS transistor 2203 and to the gate of NMOS transistor 2204. The drain of NMOS transistor 2204 is coupled to an operational voltage VD and the source of NMOS transistor 2204 is coupled to a voltage source of approximately VREF. VCONTROL can then be used as a control signal in the circuit depicted in the figures herein.

The circuit works as follows. By the action of operational amplifier 2201, the voltage VREF is superimposed on the source of the source of NMOS R-replica transistor 2203. Hence, the equivalent resistance of the NMOS R-replica transistor 2203 is Req_NEU=(VDREF−VREF)/Ibias, independently of PVT (process/voltage/temperature) variation. Since the NMOS R-replica transistor 2203 operates in the linear region, its resistance stays very much constant over its Vds (source-drain voltage) change. Hence, by using a MOS that is the same or similar in size as the NMOS R-replica transistor 2203 and with its gate controlled by the VCONTROL 2220 signal, it serves as an equivalent resistor for the resistor 1703 in FIG. 17. Furthermore, by adjusting Ibias (and/or together with VDREF and VREF), the resistance can be configured for different values as needed such as for different array size of the matrix vector multiplier configuration.

Figure 23:
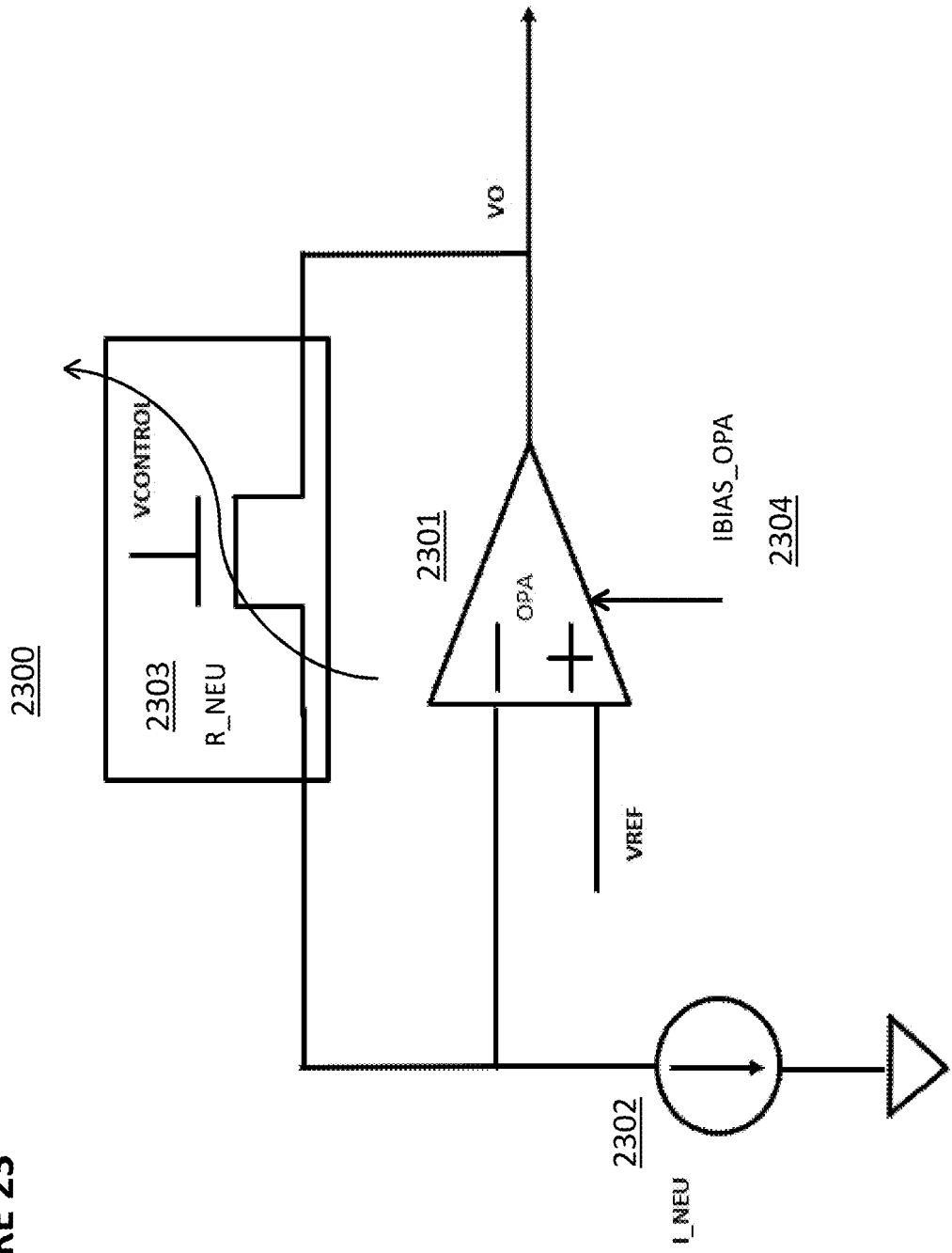
FIG. 23 depicts an embodiment of an adjustable summer circuit.

FIG. 23 depicts neuron circuit 2300 for converting summing a current and converting the current signal into a voltage signal. Neuron output circuit 2300 receives current from a VMM, such as VMM 1701, 1702, 1704, or 1705 (labeled I_NEU), which here is represented as current source 2302, which is provided to the inverting input of operational amplifier 2301. The non-inverting input of operational amplifier 2301 is coupled to a voltage source (labeled VREF). The output (labeled VO) of operational amplifier 2301 is coupled to NMOS R_NEU transistor 2303, which acts as a variable resistor of effective resistance R_NEU in response to the signal VCONTROL, which is applied to the gate of NMOS transistor 2303. The NMOS transistor 2303 size is the same or similar in size as the NMOS R_replica transistor 2203 of FIG. 22. The output voltage, Vo, is equal to the current I_NEU*R_NEU-VREF. The maximum value of I_NEU depends on the number of synapses and weight value contained in the VMM. Unlike in the design of FIG. 19, R_NEU is a variable resistance and can be adapted to the VMM size it is coupled to, for instance. R_NEU can be altered by changing IBIAS and/or VDREF and/or VREF in FIG. 23. Further, the power of the summing operational amplifier 2301 is adjusted in relation the value of the R_NEU transistor 2303 to minimize power consumption. As the value of R_NEU transistor 2303 increases, the bias (i.e., power) of the operational amplifier 2301 is reduced via current bias IBIA_OPA 2304 and vice versa.

Figure 24:
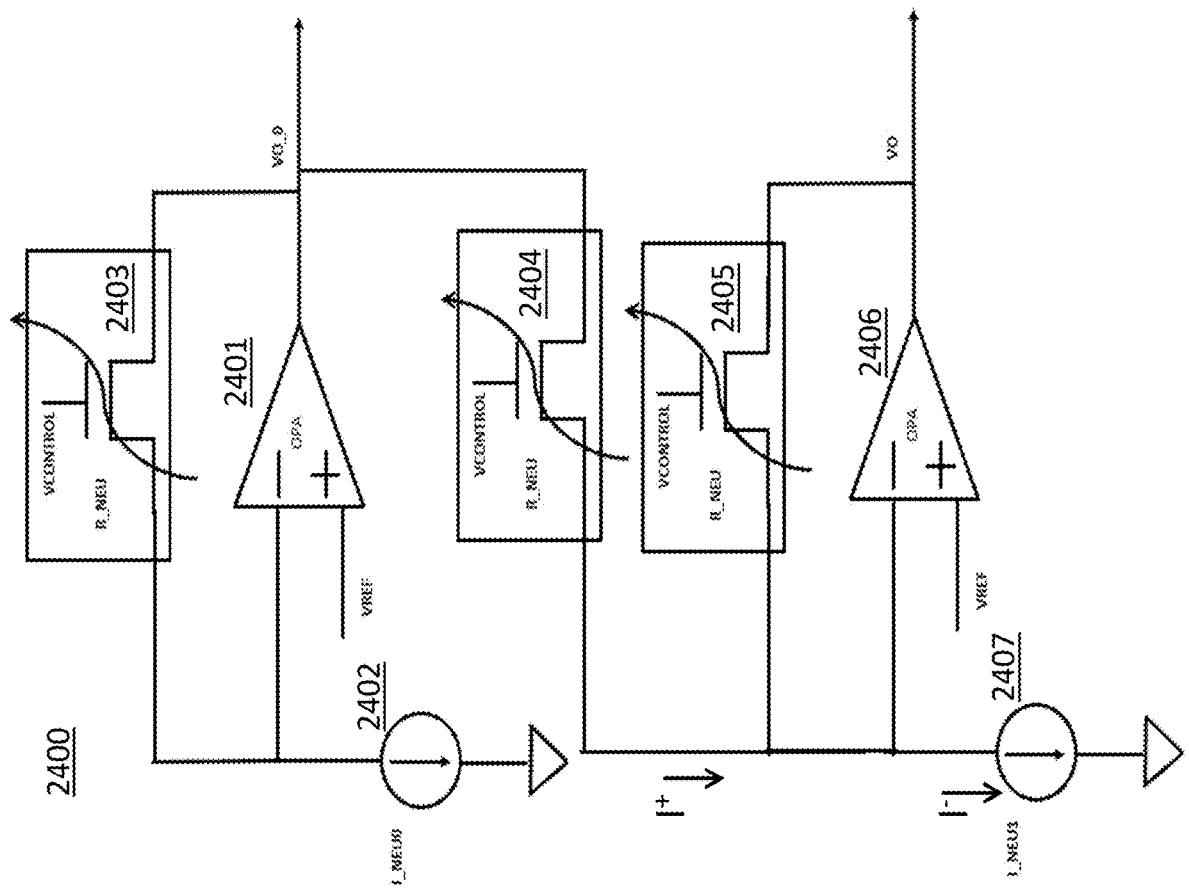
FIG. 24 depicts an embodiment of a differential adjustable summer circuit.

FIG. 24 depicts differential neuron circuit 2400 for summing differential currents and converting the differential current sums into a voltage signal. Differential neuron output circuit 2400 receives a first current from a first VMM, such as VMM 1701, 1702, 1704, or 1705 (labeled I_NEU0) and a second current from a second VMM, such as VMM 1701, 1702, 1704, or 1705 (labeled I_NEU1), which here are represented as current sources 2402 and 2407, respectively.

Current source 2402 is coupled to the inverting input of operational amplifier 2401. The non-inverting input of operational amplifier 2401 is coupled to a voltage source (labeled VREF). The output (labeled VO_0) of operational amplifier 2401 is coupled to NMOS transistor 2403, which acts as a variable resistor of effective resistance R_NEU in response to the signal VCONTROL, which is applied to the gate of NMOS transistor 2403. The output voltage, VO_0, is equal to the current I_NEU0*R_NEU-VREF. The maximum value of I_NEU depends on the number of synapses and weight value contained in the VMM. R_NEU can be altered by changing IBIAS and/or VREF and/or VDREF in FIGS. 19 and 24.

Current source 2407 is coupled to the inverting input of operational amplifier 2406 and to NMOS transistors 2404 and 2405. The non-inverting input of operational amplifier 2406 is coupled to a voltage source (labeled VREF). The output (labeled VO) of operational amplifier 2406 is coupled to NMOS transistor 2405, which acts as a variable resistor of effective resistance R_NEU in response to the signal VCONTROL, which is applied to the gate of NMOS transistor 2405. NMOS transistor 2405 is coupled to VO_0 through NMOS transistor 2404. NMOS transistor 2404 acts as a variable resistor of effective resistance R_NEU in response to the signal VCONTROL, which is applied to the gate of NMOS transistor 2404. The output voltage, VO, is equal to $(I^+ - I^-)*R\_NEU - VREF$. $I^+ = I\_NEU0$ and $I^- = I\_NEU1$.

Figure 25:
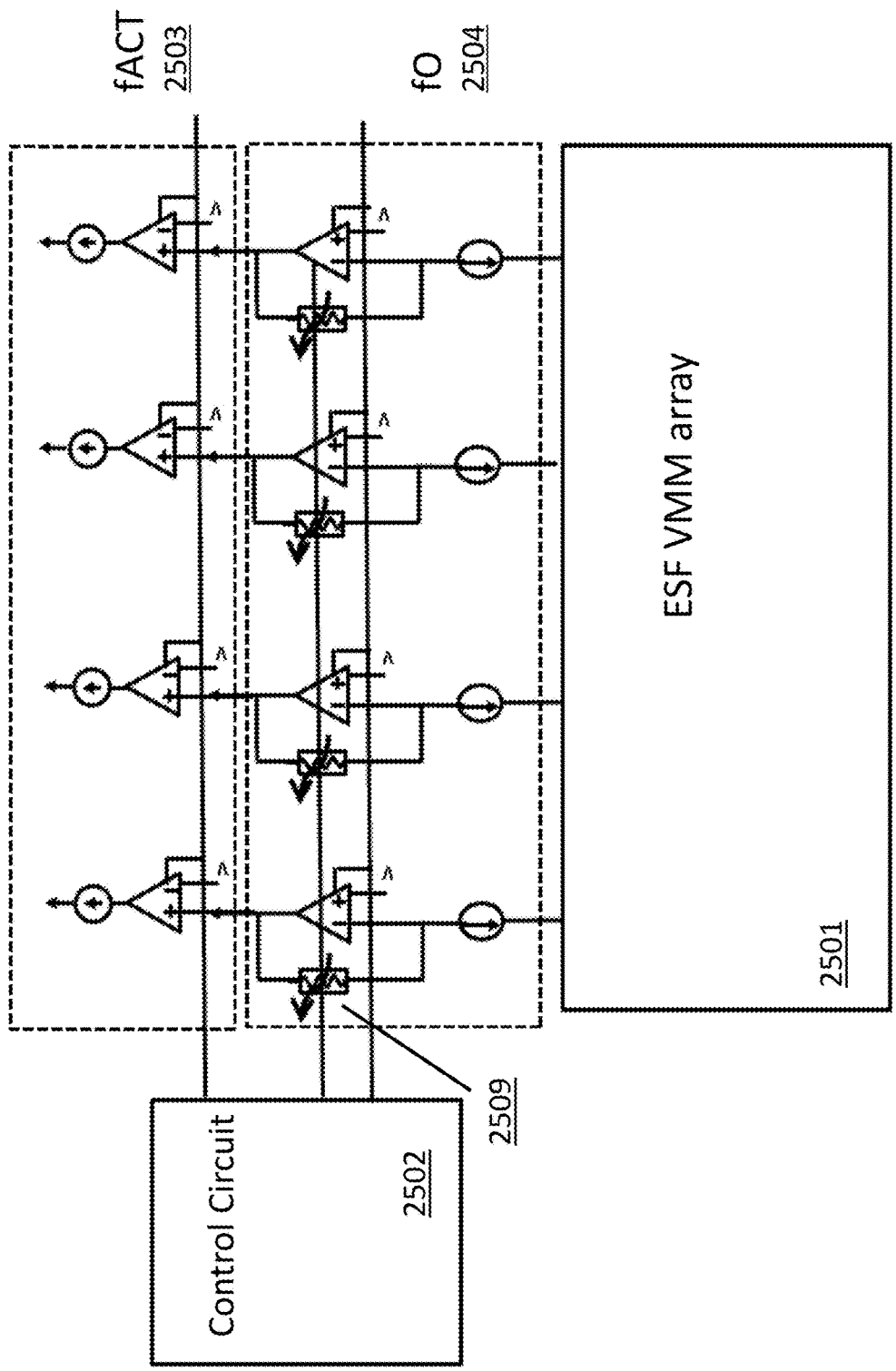
FIG. 25 depicts an embodiment of an artificial neural network stage comprising a VMM array, a summer circuit, an activation function circuit, and a control circuit

FIG. 25 depicts system 2500. System 2500 comprises VMM array 2501, neuron circuits 2504 (such as neuron circuits 2000, 2300, 2400, 2500, 2700, 2800, and 2900, activation function circuits 2503 (such as activation function circuit 3000), and control circuit 2502 (such as control systems 2200 or 2300) for controlling R_NEU 2509 (variable resistance), IBIAS, and VCONTROL. The control circuit 2500 provides the control, bias, and configurability for the summer circuit 2504 (such as configured variable resistance and operational amplifier circuit bias) and activation circuit 2503 (such as bias).

Figure 26:
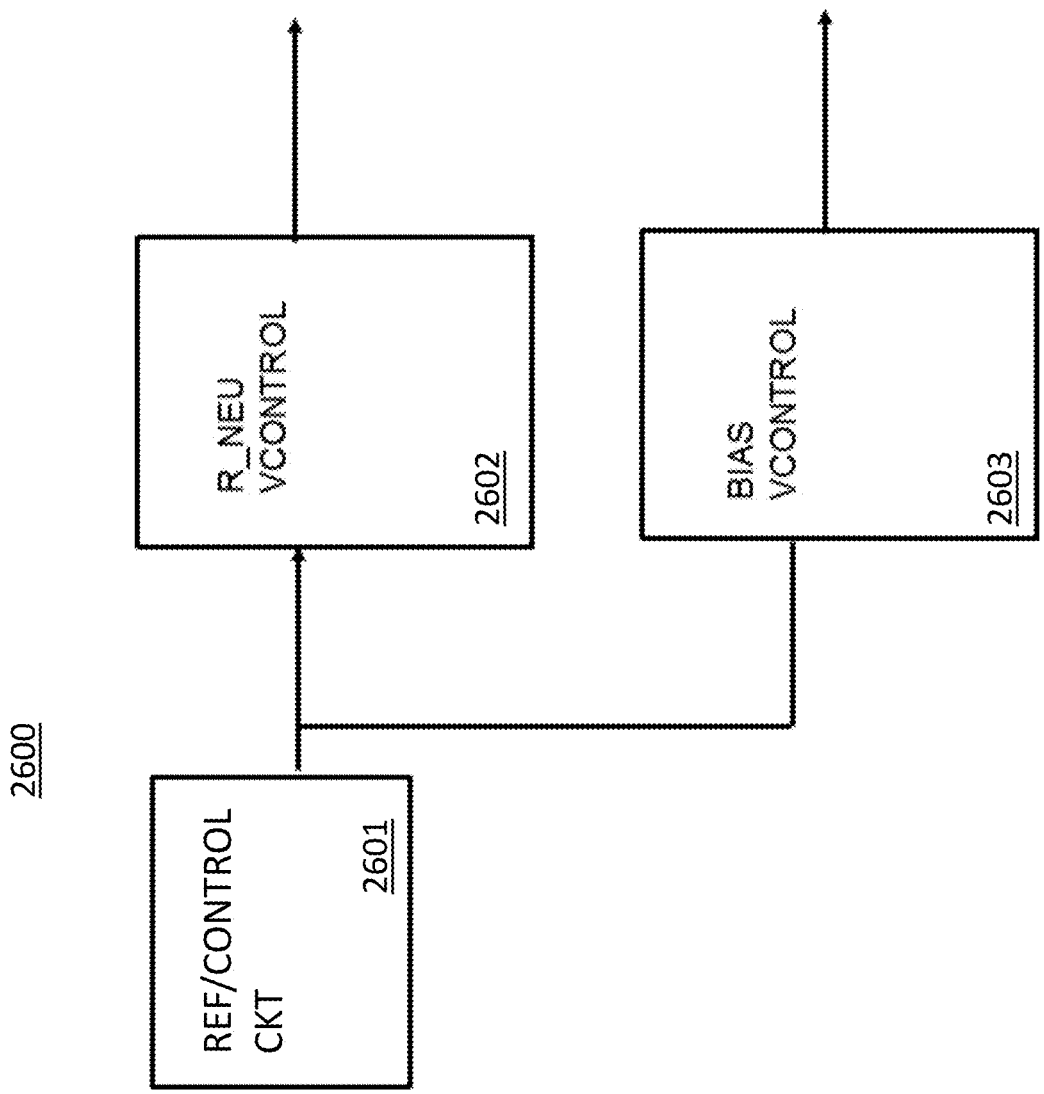
FIG. 26 depicts a reference control circuit.

FIG. 26 depicts control system 2600. Control system 2600 comprises reference circuit 2601 which provides and trim-bits or configuration bits, reference current and reference voltage to configure circuit 2602 that provides VCONTROL (to control variable resistance for the summer circuits) or circuit 2603 that generates bias for operational amplifier circuits during a configuration process and/or during a trim process.

Figure 27:
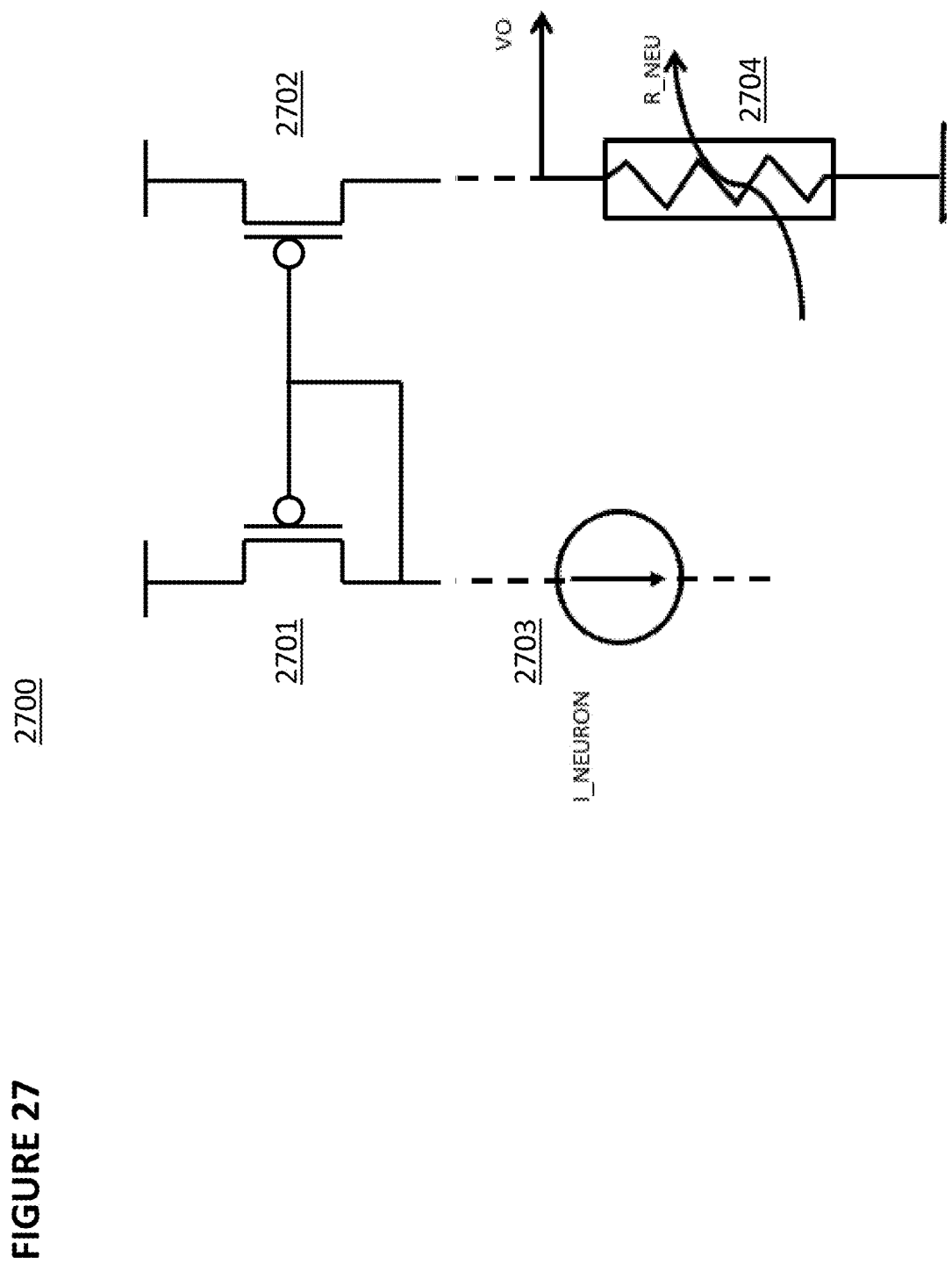
FIG. 27 depicts an embodiment of an adjustable summer circuit

FIG. 27 depicts adaptable neuron 2700. Adaptable neuron 2700 comprises PMOS transistors 2701 and 2702 arranged in a current mirror configuration. PMOS transistor 2701 is coupled to I_NEURON 2703, which is a current source that represents the current from a VMM, such as VMM 1701, 1702, 1704, or 1705. That current is mirrored in the drain of PMOS transistor 2702, which is provided to variable resistor 2704. Thus, adaptable neuron 2700 converts a current signal (I_NEURON) into a voltage signal (VO).

Figure 28:
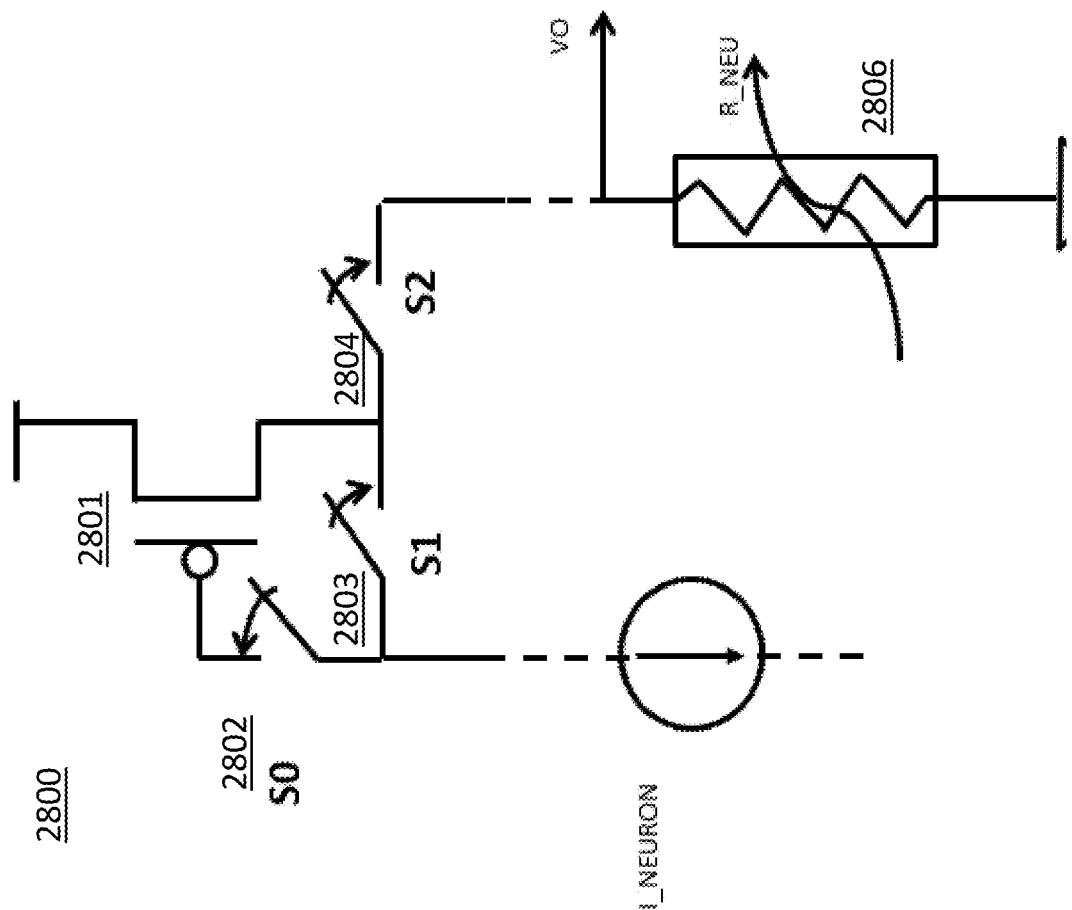
FIG. 28 depicts an embodiment of an adjustable summer circuit.

FIG. 28 depicts adaptable neuron 2800. One drawback of adaptable neuron 2700 in FIG. 27 is that a mismatch between PMOS transistors 2701 and 2702 can affect performance. FIG. 28 eliminates this issue by using only one PMOS transistor 2801 and essentially configuring it to mirror itself (i.e., a sample and hold mirror) using switches 2802, 2803, and 2804. Initially, switch 2802 and switch 2803 are closed and switch 2804 is open, at which time PMOS transistor 2801 is coupled to I_NEURON, which is a current source that represents the current from a VMM, such as VMM 1701, 1702, 1704, or 1705. Then, switch 2802 and 2803 are opened and switch 2804 is closed, which causes PMOS transistor 2801 to send current I_NEURON from its drain to variable resistor 2806. Thus, adaptable neuron 2800 converts a current signal (I_NEURON) into a voltage signal (VO). Basically the transistor 2801 samples the current I_NEURON and holds it by storing sampled gate-source voltage on its gate.

Figure 29:
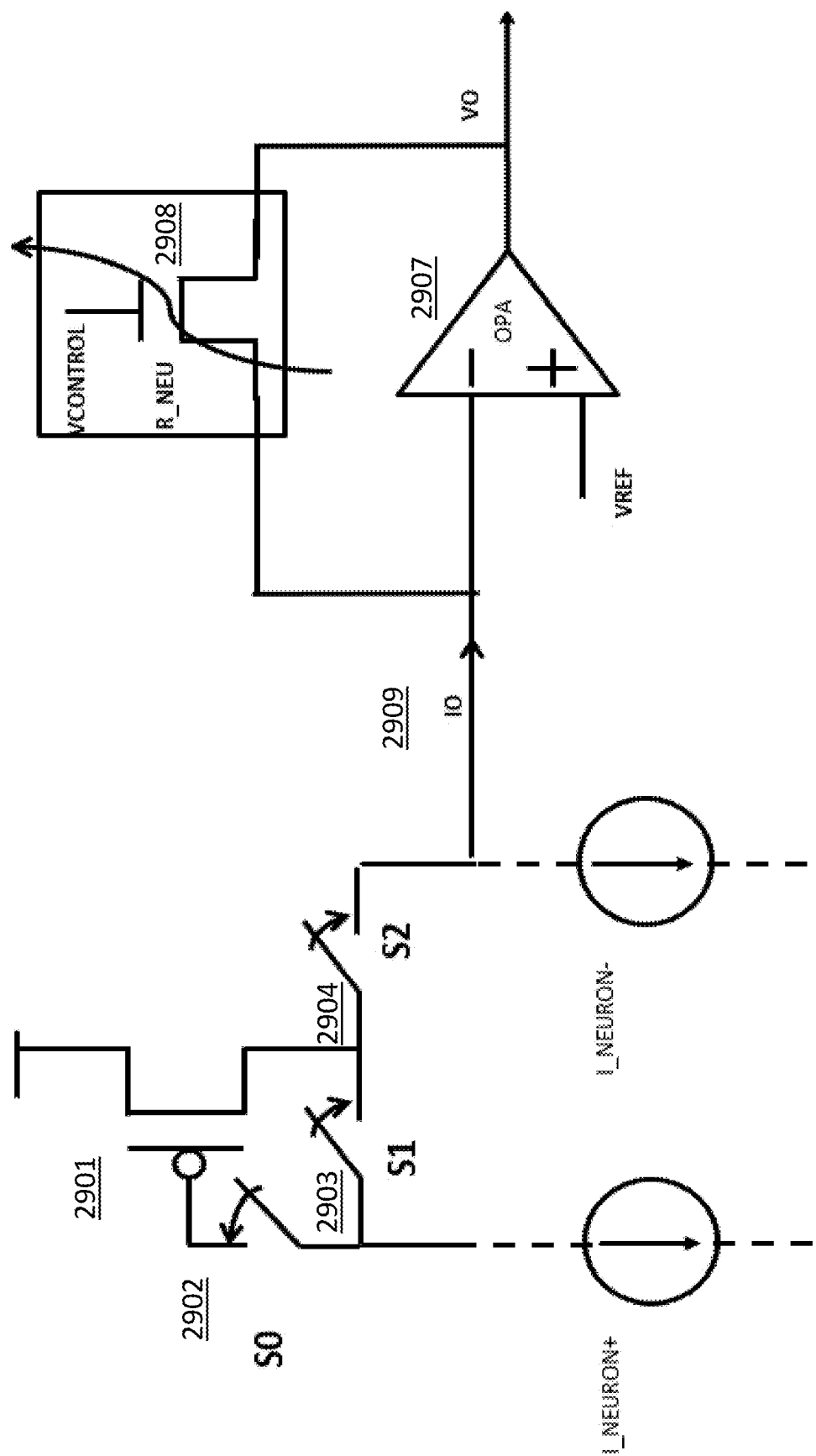
FIG. 29 depicts an embodiment of a differential adjustable summer circuit.

FIG. 29 depicts a differential adaptable neuron 2900. Differential adaptable neuron 2900 comprises I_NEURON+, which is a current source that represents the current from a first VMM, such as VMM 1701, 1702, 1704, or 1705, and I_NEURON−, which is a current source that represents the current from a second VMM, such as VMM 1701, 1702, 1704, or 1705. Initially, switch 2902 and 2903 are closed and switch 2904 is open. Then, switch 2902 and 2903 are opened and switch 2904 is closed, which causes PMOS transistor 2901 to send current I_NEURON+ from its drain. Node 2909 then receives current IO, which is equal to I_NEURON+ minus I_NEURON−. Node 2909 is coupled to the inverting input of operational amplifier 2907 and to a terminal of NMOS transistor 2908. The non-inverting input of operational amplifier 2907 is coupled to a voltage source, VREF. Another terminal of NMOS transistor 2908 is coupled to the output of operational amplifier 2907, which is VO. NMOS transistor 2908 acts as a variable resistor in response to the signal VCONTROL on its gate. Thus, differential adaptable neuron 2900 converts a differential current signal (I_NEURON+−I_NEURON−) into a voltage signal (VO=(I_NEURON+−I_NEURON−)*R_NEU−VREF).

Programmable neurons shown in FIGS. 20, 23, 24, 25, 27, 28, and 29 hence can be configured to adapt to the requirements of each VMM to realize desired operation with optimized power.

An alternative embodiment for the variable resistor can comprise a switched capacitance circuit, wherein the equivalent resistance is inversely proportional to the capacitance value and switching frequency.

Figure 30:
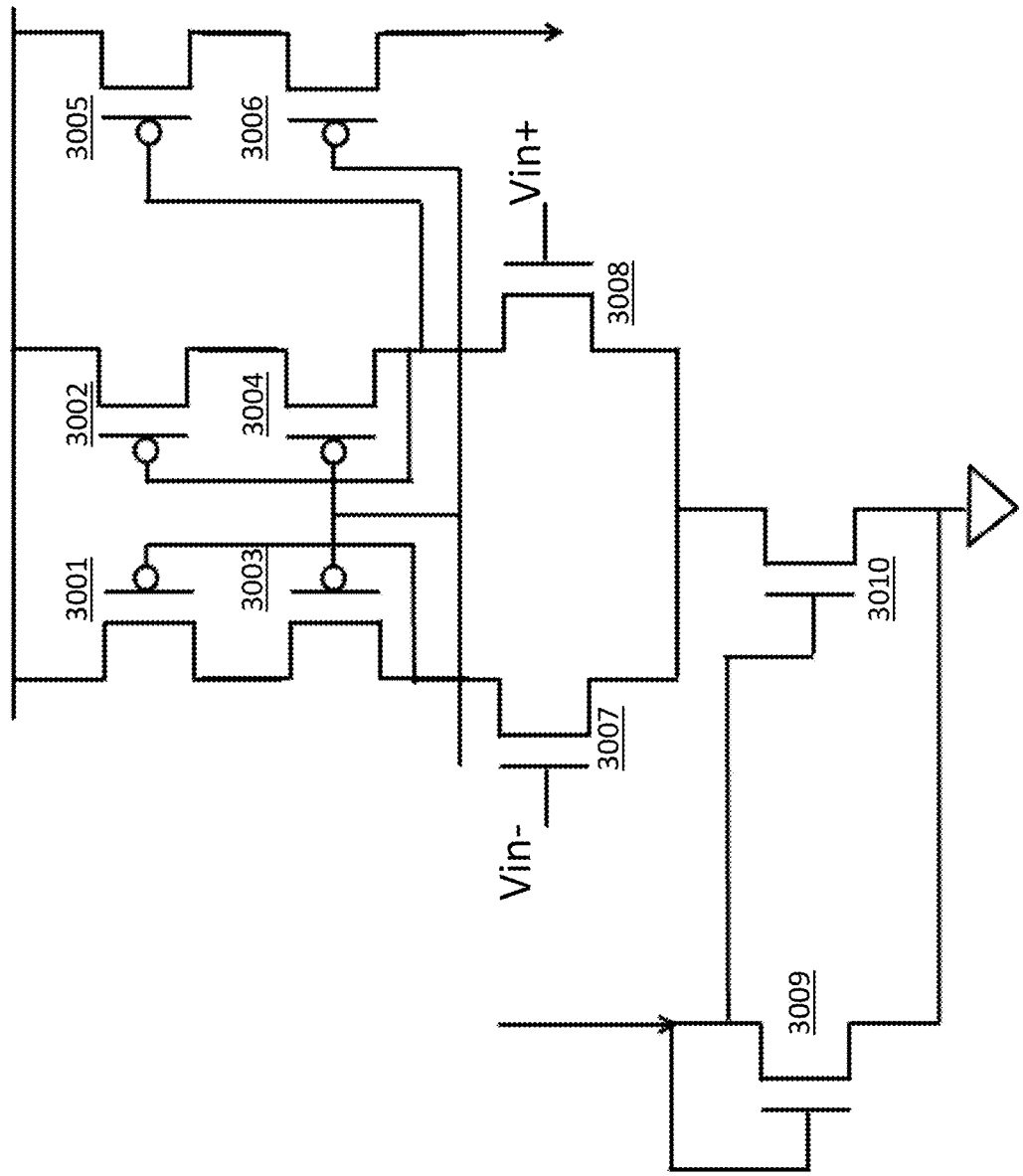
FIG. 30 depicts an embodiment of an activation function circuit.

FIG. 30 depicts activation function circuit 3000, which converts an input voltage pair (Vin+ and Vin−) into a current (Iout_neu) using a tan h function. Activation function circuit 3000 comprises PMOS transistors 3001, 3002, 3003, 3004, 3005, and 3006 and NMOS transistors 3007, 3008, 3009, and 3010, configured as shown. The transistors 3003, 3004, and 3006 serve as cascoding transistors. The input NMOS pair 3007 and 3008 operates in sub-threshold region to realize the tan h function. The current I_neu_max is the maximum neuron current that can be received from the attached VMM (not shown).

Figure 31:
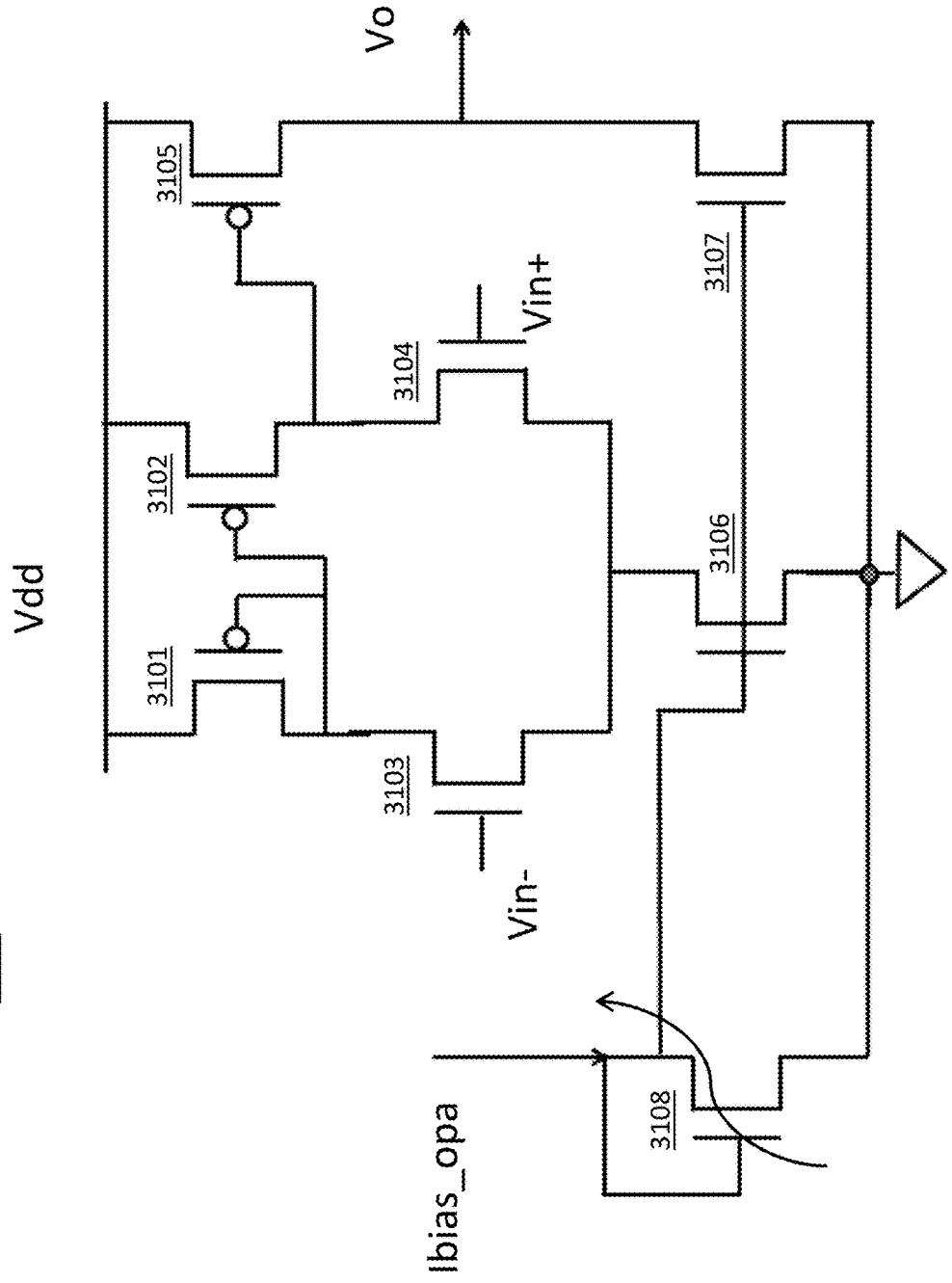
FIG. 31 depicts an embodiment of an operational amplifier.

FIG. 31 depicts operational amplifier 3100 used in the summer circuit to convert a current into a voltage. Operational amplifier 3100 comprises PMOS transistors 3101, 3102, and 3105, NMOS transistors 3103, 3104, 3106, and 3107, and NMOS transistor 3108 that acts as a variable bias, in the configuration shown. The input terminals to operational amplifier 3100 are labeled Vin+ (applied to the gate of NMOS transistor 3104) and Vin− (applied to the gate of NMOS transistor 3103), and the output is VO.

Figure 32:
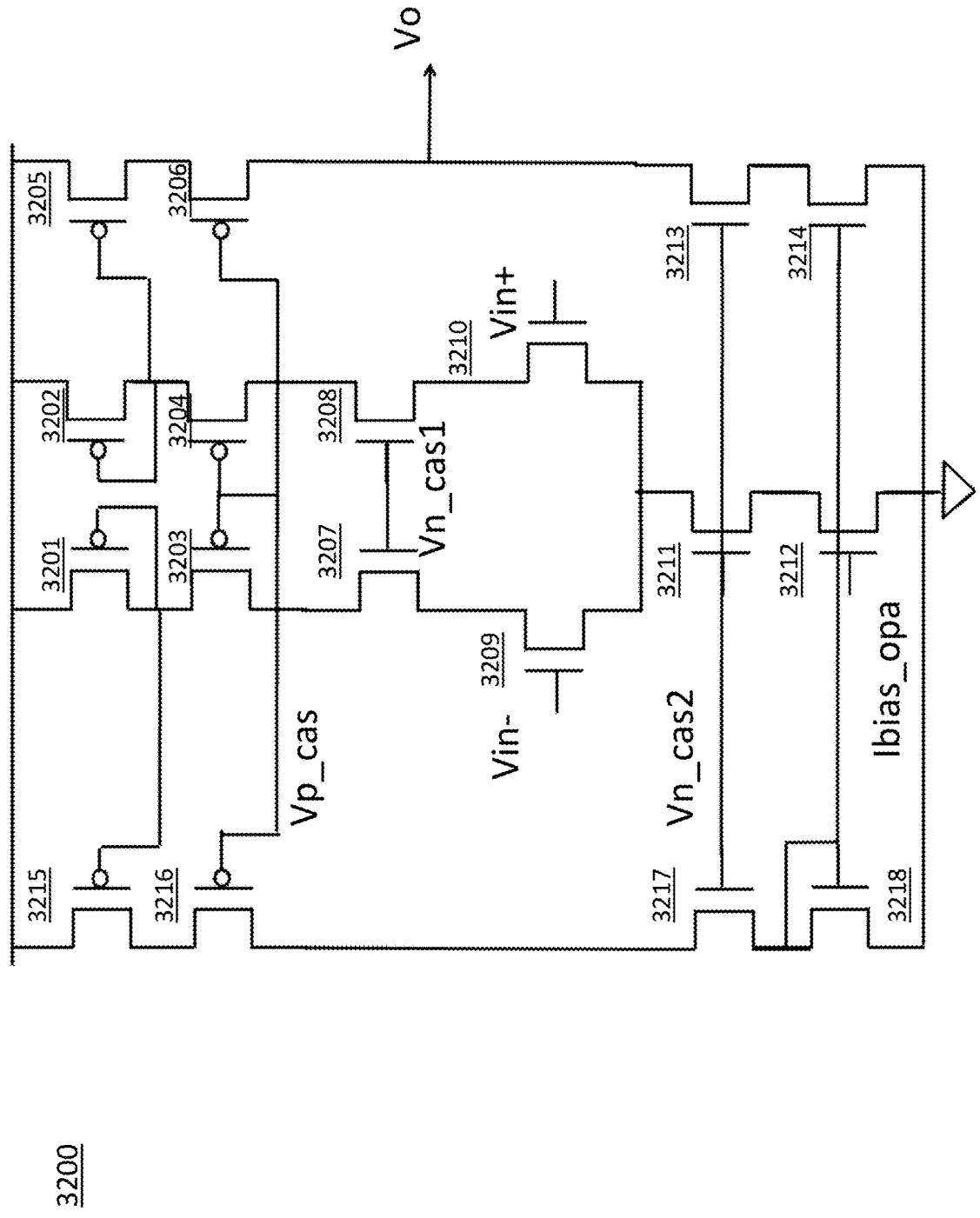
FIG. 32 depicts an embodiment of a high voltage operational amplifier.

FIG. 32 depicts high voltage operational amplifier 3200 used in the control circuit to provide voltage control signal VCONTROL. High voltage operational amplifier 3200 utilizes cascoding structure to avoid high voltage breakdown. High voltage operational amplifier 3200 comprises PMOS transistors 3215 and 3216 arranged in a cascode configuration, PMOS transistors 3205 and 3206 arranged in a cascode configuration, PMOS transistors 3201 and 3203 arranged in a cascode configuration, PMOS transistors 3202 and 3204 arranged in a cascode configuration. High voltage operational amplifier 3200 further comprises NMOS transistors 3207 and 3209 arranged in a cascode configuration, NMOS transistors 3208 and 3210 arranged in a cascode configuration, NMOS transistors 3217 and 3218 arranged in a cascode configuration, NMOS transistors 3211 and 3212 arranged in a cascode configuration, and NMOS transistors 3213 and 3214 arranged in a cascode configuration. Input voltages Vin+ and Vin− are applied to the gates of NMOS transistors 3210 and 3209, respectively, and the output is Vo. All transistors in high voltage operational amplifier 3200 are high voltage transistors.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. An artificial neural network, comprising:
   a vector-by-matrix multiplication array comprising rows and columns of flash memory cells;
   a summer circuit for receiving a current from the vector-by-matrix multiplication array and for generating an output voltage in response to the received current, the summer circuit comprising an adjustable circuit element a variable resistor; and
   a control system for adjusting the variable resistor in response to a set of bits, wherein the set of bits comprises one or more of configuration bits and trim bits.

2. The artificial neural network of claim 1, further comprising:
   an activation function circuit for receiving the output voltage from the summer circuit as an input and generating an output current in response to the output voltage.

3. The artificial neural network of claim 2, wherein the activation function circuit executes a hyperbolic tangent function on the input to generate the output current.

4. The artificial neural network of claim 2, wherein the activation function circuit executes a ReLU function on the input to generate the output current.

5. The artificial neural network of claim 2, wherein the activation function circuit executes a Sigmoid function on the input to generate the output current.

6. The artificial neural network of claim 1, wherein the variable resistor comprises discrete resistor elements.

7. The artificial neural network of claim 1, wherein the variable resistor comprises a MOS transistor.

8. The artificial neural network of claim 1, wherein the summer circuit comprises an operational amplifier.

9. The artificial neural network of claim 8, wherein a bias for the operational amplifier is adjusted per vector matrix multiplier array size.

10. The artificial neural network of claim 9, wherein the bias for the operational amplifier is based on the value of the variable resistor.

11. The artificial neural network of claim 1, wherein the current from the vector-by-matrix multiplication array is provided on a bit line of the vector-by-matrix multiplication array.

12. The artificial neural network of claim 1, wherein the current from the vector-by-matrix multiplication array is provided on a source line of the vector-by-matrix multiplication array.

13. The artificial neural network of claim 1, wherein the flash memory cells are split gate memory cells.

14. An artificial neural network, comprising:
   a vector-by-matrix multiplication array comprising rows and columns of flash memory cells;
   a summer circuit for receiving a differential input current signal from the vector-by matrix multiplication array and for generating an output voltage in response to the differential input current signal, the summer circuit comprising a variable resistor; and
   a control system for adjusting the variable resistor in response to a set of bits, wherein the set of bits comprises one or more of configuration bits and trim bits.

15. The artificial neural network of claim 14, further comprising:
   an activation function circuit for receiving the output voltage from the summer circuit and generating an output current in response to the output voltage.

16. The artificial neural network of claim 15, wherein the activation function circuit executes a hyperbolic tangent function on the input to generate the output current.

17. The artificial neural network of claim 15, wherein the activation function circuit executes a ReLU function on the input to generate the output current.

18. The artificial neural network of claim 15, wherein the activation function circuit executes a Sigmoid function on the input to generate the output current.

19. The artificial neural network of claim 14, wherein the summer circuit comprises an operational amplifier.

20. The artificial neural network of claim 19, wherein a bias for the operational amplifier is adjusted per vector matrix multiplier array size.

21. The artificial neural network of claim 20, wherein the bias for the operational amplifier is a relation to the value of the adjusted circuit element.

22. The artificial neural network of claim 14, wherein the variable resistor comprises discrete resistor elements.

23. The artificial neural network of claim 14, wherein the variable resistor comprises a MOS transistor.

24. The artificial neural network of claim 14, wherein the current from the vector-by-matrix multiplication array is provided on a bit line of the vector-by-matrix multiplication array.

25. The artificial neural network of claim 14, wherein the current from the vector-by-matrix multiplication array is provided on a source line of the vector-by-matrix multiplication array.

26. The artificial neural network of claim 14, wherein the flash memory cells are split gate memory cells.

27. A programmable neuron for an artificial neural network, comprising:
a vector-by-matrix multiplication array comprising rows and columns of flash memory cells;
a neuron output circuit for receiving a current from the vector-by-matrix multiplication array and for generating an output in response to the received current, the neuron output circuit comprising an adjustable circuit element comprising a variable resistor; and a control system for adjusting the adjustable circuit element in response to a set of bits, wherein the variable resistor is configured by the set of bits and the set of bits comprises one or more of configuration bits and trimbits.

28. The programmable neuron of claim 27, wherein the neuron output circuit comprises an activation function circuit for receiving the output voltage from a summer circuit as an input and generating an output current in response to the output voltage.

29. The programmable neuron of claim 28, wherein the activation function circuit executes a hyperbolic tangent function on the input to generate the output current.

30. The programmable neuron of claim 28, wherein the activation function circuit executes a ReLU function on the input to generate the output current.

31. The programmable neuron of claim 28, wherein the activation function circuit executes a Sigmoid function on the input to generate the output current.

32. The programmable neuron of claim 27, wherein the variable resistor comprises discrete resistor elements.

33. The programmable neuron of claim 27, wherein the variable resistor comprises a MOS transistor.

34. The programmable neuron of claim 27, wherein the summer circuit comprises an operational amplifier.

35. The programmable neuron of claim 34, wherein a bias for the operational amplifier is adjusted per vector matrix multiplier array size.

36. The programmable neuron of claim 35, wherein the bias for the operational amplifier is based on the value of the adjusted circuit element.

37. The programmable neuron of claim 27, wherein the current from the vector-by-matrix multiplication array is provided on a bit line of the vector-by-matrix multiplication array.

38. The programmable neuron of claim 27, wherein the current from the vector-by-matrix multiplication array is provided on a source line of the vector-by-matrix multiplication array.

39. The programmable neuron of claim 27, wherein the flash memory cells are split gate memory cells.

* * * * *